United States Patent
Lee et al.

(10) Patent No.: US 12,342,664 B2
(45) Date of Patent: Jun. 24, 2025

(54) LIGHT EMITTING ELEMENT, MANUFACTURING METHOD THEREOF, AND DISPLAY DEVICE COMPRISING THE LIGHT EMITTING ELEMENT

(71) Applicant: Samsung Display Co., LTD., Yongin-si (KR)

(72) Inventors: Seung Geun Lee, Hwaseong-si (KR); Dong Uk Kim, Hwaseong-si (KR); Dae Hyun Kim, Hwaseong-si (KR); Se Young Kim, Gwangju (KR); Hyun Min Cho, Seoul (KR); Hyung Rae Cha, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 600 days.

(21) Appl. No.: 17/626,019

(22) PCT Filed: Jun. 3, 2020

(86) PCT No.: PCT/KR2020/007230
§ 371 (c)(1),
(2) Date: Jan. 10, 2022

(87) PCT Pub. No.: WO2021/006484
PCT Pub. Date: Jan. 14, 2021

(65) Prior Publication Data
US 2022/0254959 A1    Aug. 11, 2022

(30) Foreign Application Priority Data
Jul. 10, 2019   (KR) .................. 10-2019-0083467

(51) Int. Cl.
*H10H 20/831*    (2025.01)
*H10H 20/01*    (2025.01)
*H10H 29/14*    (2025.01)

(52) U.S. Cl.
CPC ........ *H10H 20/8312* (2025.01); *H10H 20/01* (2025.01); *H10H 20/8316* (2025.01); *H10H 29/142* (2025.01); *H10H 20/032* (2025.01)

(58) Field of Classification Search
CPC ....... H01L 33/44; H01L 33/382; H01L 33/18; H01L 33/38; H01L 33/387;
(Continued)

(56) References Cited

U.S. PATENT DOCUMENTS 7,964,884 B2   6/2011 Lee
7,999,279 B2   8/2011 Lee
(Continued)

FOREIGN PATENT DOCUMENTS

CN    101084583    12/2007
CN    104396033    3/2015
(Continued)

OTHER PUBLICATIONS

Extended European Search Report for European Patent Application No. 20837829.9, dated Jul. 6, 2023.
(Continued)

*Primary Examiner* — Moazzam Hossain
(74) *Attorney, Agent, or Firm* — KILE PARK REED & HOUTTEMAN PLLC

(57) ABSTRACT

A light emitting element having a shape extending in a direction includes a first semiconductor layer and a second semiconductor layer, an active layer between the first and second semiconductor layers, a first electrode layer on a second surface opposite to a first surface of the first semiconductor layer facing the active layer, a second electrode layer on a second surface opposite to a first surface of the second semiconductor layer facing the active layer, and an insulating film surrounding a side surface of the active layer, a side surface of the first electrode layer, and a side surface
(Continued)

of the second electrode layer, wherein a first area including the insulating film adjacent to a side surface of the active layer has a thickness larger than a thickness of a second area including the insulating film adjacent to a side surface of the first electrode layer.

9 Claims, 24 Drawing Sheets

(58) Field of Classification Search
CPC ........... H01L 2933/0016; H01L 27/156; H01L 27/153; H10H 29/142; H10H 20/84; H10H 20/818; H10H 20/832
See application file for complete search history.

(56) References Cited

U.S. PATENT DOCUMENTS

| | | |
|---|---|---|
| 8,008,101 B2 | 8/2011 | Lee |
| 8,039,861 B2 | 10/2011 | Lee |
| 8,143,640 B2 | 3/2012 | Lee |
| 8,274,094 B2 | 9/2012 | Lee |
| 10,672,946 B2 | 6/2020 | Cho et al. |
| 11,114,582 B2 | 9/2021 | Cho et al. |
| 12,040,425 B2 | 7/2024 | Cho et al. |
| 2012/0119249 A1 | 5/2012 | Kim et al. |
| 2012/0146081 A1 | 6/2012 | Lee |
| 2014/0145237 A1 | 5/2014 | Do et al. |
| 2015/0155331 A1* | 6/2015 | Guenard ................. H10F 10/17 438/34 |
| 2018/0019369 A1* | 1/2018 | Cho .................... H01L 25/0753 |
| 2018/0287010 A1* | 10/2018 | Sung ................ H10H 20/01335 |
| 2020/0035860 A1* | 1/2020 | Michiue ................ H10H 20/825 |

FOREIGN PATENT DOCUMENTS

| | | |
|---|---|---|
| EP | 3 270 413 | 1/2018 |
| JP | 2012-256924 | 12/2012 |
| KR | 10-2009-0074091 | 7/2009 |
| KR | 10-2012-0122159 | 11/2012 |
| KR | 10-2012-0122160 | 11/2012 |
| KR | 10-2013-0012704 | 2/2013 |
| KR | 10-2013-0027879 | 3/2013 |
| KR | 10-1436123 | 11/2014 |
| KR | 10-2014-0145511 | 12/2014 |
| KR | 10-2016-0059576 | 5/2016 |
| KR | 10-2016-0073649 | 6/2016 |
| KR | 10-2018-0007376 | 1/2018 |
| KR | 10-2018-0009014 | 1/2018 |

OTHER PUBLICATIONS

International Search Report, with English translation, corresponding to International Application No. PCT/KR2020/007230 dated Sep. 24, 2020.
Written Opinion, with English translation, corresponding to International Application No. PCT/KR2020/007230, dated Sep. 24, 2020.

* cited by examiner

LIGHT EMITTING ELEMENT, MANUFACTURING METHOD THEREOF, AND DISPLAY DEVICE COMPRISING THE LIGHT EMITTING ELEMENT

CROSS-REFERENCE TO RELATED APPLICATION(S)

This application is a national entry of International Application No. PCT/KR2020/007230, filed on Jun. 3, 2020, which claims under 35 U.S.C. 119(a) and 365(b) priority to and benefits of Korean Patent Application No. 10-2019-0083467, filed on Jul. 10, 2019 in the Korean Intellectual Property Office, the entire contents of which are herein incorporated by reference.

BACKGROUND

1. Technical Field

The disclosure relates to a light emitting element, a manufacturing method therefor, and a display device including the light emitting element.

2. Discussion of the Related Art

The importance of display devices is increasing with the development of multimedia. Accordingly, various types of display devices such as light-emitting display devices and liquid crystal display (LCD) devices are being used.

A display panel such as an light-emitting display panel or an LCD panel may be a device included in a display device to display an image. Among such display panels, light-emitting elements may be provided as a light-emitting display panel, and examples of a light-emitting diode (LED) include an organic LED (OLED) using an organic material as a fluorescent material and an inorganic LED using an inorganic material as a fluorescent material.

SUMMARY

Aspects of the disclosure provide a light emitting element including electrode layers and an insulating film surrounding the electrode layers, and a manufacturing method therefor.

Aspects of the disclosure also provides a display device including the light emitting element and capable of displaying lights of various colors.

It should be noted that aspects of the disclosure are not limited thereto and other aspects, which are not mentioned herein, will be apparent to those of ordinary skill in the art from the following description.

According to an embodiment of the disclosure, a light emitting element having a shape extending in a direction may include a first semiconductor layer and a second semiconductor layer, an active layer between the first semiconductor layer and the second semiconductor layer, a first electrode layer disposed on a second surface opposite to a first surface of the first semiconductor layer facing the active layer, a second electrode layer disposed on a second surface opposite to a first surface of the second semiconductor layer facing the active layer, and an insulating film surrounding a side surface of the active layer, at least a part of a side surface of the first electrode layer, and at least a part of a side surface of the second electrode layer, wherein a first area including the insulating film adjacent to a side surface of the active layer has a thickness larger than a thickness of a second area including the insulating film adjacent to a side surface of the first electrode layer.

The insulating film may include a first surface extending in the direction of the light emitting element, a second surface extending between the first surface and a side surface of the first electrode layer, and a third surface extending between the first surface and a side surface of the second electrode layer.

At least a part of the second surface may have a curved shape.

The third surface may be formed as a flat surface, and the third surface and a surface of the second electrode layer may be coplanar.

A distance between the active layer and the first electrode layer may be greater than a distance between the active layer and the second electrode layer.

A width of the first surface of the first semiconductor layer may be greater than a width of the second surface of the first semiconductor layer.

The active layer may emit first light having a central wavelength band ranging from about 450 nm to about 495 nm.

The light emitting element may further comprise a third semiconductor layer between the first semiconductor layer and the active layer, a fourth semiconductor layer between the active layer and the second semiconductor layer, and a fifth semiconductor layer between the fourth semiconductor layer and the second semiconductor layer.

The active layer may emit first light having a central wavelength band ranging from about 620 nm to about 750 nm.

According to an embodiment of the disclosure, a manufacturing method for a light emitting element, may include preparing a semiconductor structure formed on an underlying substrate, forming a support layer on a first surface of the semiconductor structure to separate the semiconductor structure from the underlying substrate, forming a first electrode layer on a second surface of the semiconductor structure separated from the underlying substrate, etching the semiconductor structure in a direction perpendicular to the support layer to form a semiconductor crystal, forming an insulating film surrounding a side surface of the semiconductor crystal, and separating the semiconductor crystal on which the insulating film may be formed from the support layer.

The semiconductor structure may include a first semiconductor layer, an active layer formed on the first semiconductor layer, a second semiconductor layer formed on the active layer, and a second electrode layer formed on the second semiconductor layer, and the first surface of the semiconductor structure may be a top surface of the second electrode layer.

The underlying substrate may include a base substrate and a separation layer formed on the base substrate, and the separating of the semiconductor structure may comprise separating the semiconductor structure from the base substrate by removing the separation layer.

The second surface of the semiconductor structure may be a bottom surface of the first semiconductor layer, and the forming of the semiconductor crystal may comprise etching the semiconductor structure in a direction from a top surface of the first electrode layer to a bottom surface of the second electrode layer.

The forming of the insulating film may comprise forming an insulating coating film surrounding an outer surface of the semiconductor crystal, and removing the insulating coating film to expose the top surface of the first electrode layer.

The insulating film may include a first surface extending in a direction, a second surface extending between the first surface and a side surface of the first electrode layer, and a third surface extending between the first surface and a side surface of the second electrode layer, and at least a part of the second surface may have a curved shape.

According to an embodiment of the disclosure, a display device may include a first pixel and a second pixel, a substrate, a first electrode disposed on the substrate, a second electrode disposed on the substrate and spaced apart from the first electrode, and at least one light emitting element between the first electrode and the second electrode, wherein the light emitting element may include a first semiconductor layer and a second semiconductor layer, an active layer between the first semiconductor layer and the second semiconductor layer, a first electrode layer disposed on a second surface opposite to a first surface of the first semiconductor layer facing the active layer, a second electrode layer disposed on a second surface opposite to a first surface of the second semiconductor layer facing the active layer, and an insulating film surrounding a side surface of the active layer, at least a part of a side surface of the first electrode layer, and at least a part of a side surface of the second electrode layer, and a first area including the insulating film adjacent to a side surface of the active layer has a thickness larger than a thickness of a second area including the insulating film adjacent to a side surface of the first electrode layer.

The insulating film may include a first surface extending in a direction, a second surface extending between the first surface and a side surface of the first electrode layer, and a third surface extending between the first surface and a side surface of the second electrode layer, and at least a part of the second surface may have a curved shape.

The display device may further comprise a first contact electrode electrically contacting the first electrode and the second electrode layer; and a second contact electrode electrically contacting the second electrode and the first electrode layer.

The light emitting element may include a first light emitting element disposed in the first pixel, and a second light emitting element disposed in the second pixel, and an active layer of the first light emitting element may emit first light having a central wavelength band ranging from about 450 nm to about 495 nm.

The second light emitting element may further include a third semiconductor layer disposed between the first semiconductor layer and the active layer, a fourth semiconductor layer disposed between the active layer and the second semiconductor layer, and a fifth semiconductor layer disposed between the fourth semiconductor layer and the second semiconductor layer, and an active layer of the second light emitting element may emit first light having a central wavelength band ranging from about 620 nm to about 750 nm.

The details of other embodiments are included in the detailed description and the accompanying drawings.

In a manufacturing method for a light emitting element according to an embodiment, a light emitting element having a first electrode layer and a second electrode layer can be manufactured by performing two separation steps and an etching step. The light emitting element may include an insulating film surrounding the first electrode layer and the second electrode layer, and the insulating film surrounding a lateral surface of the first electrode layer may have a partially curved surface.

In the manufacturing method for the light emitting element according to an embodiment, although the light emitting element may be manufactured through the etching process of etching semiconductor layers stacked on top of each other, the electrodes layers can be protected by forming the insulating film surrounding the electrode layers.

The effects according to the embodiments are not limited by the contents described above, and more various effects are included in this disclosure.

DETAILED DESCRIPTION OF THE EMBODIMENTS

Figure 1:
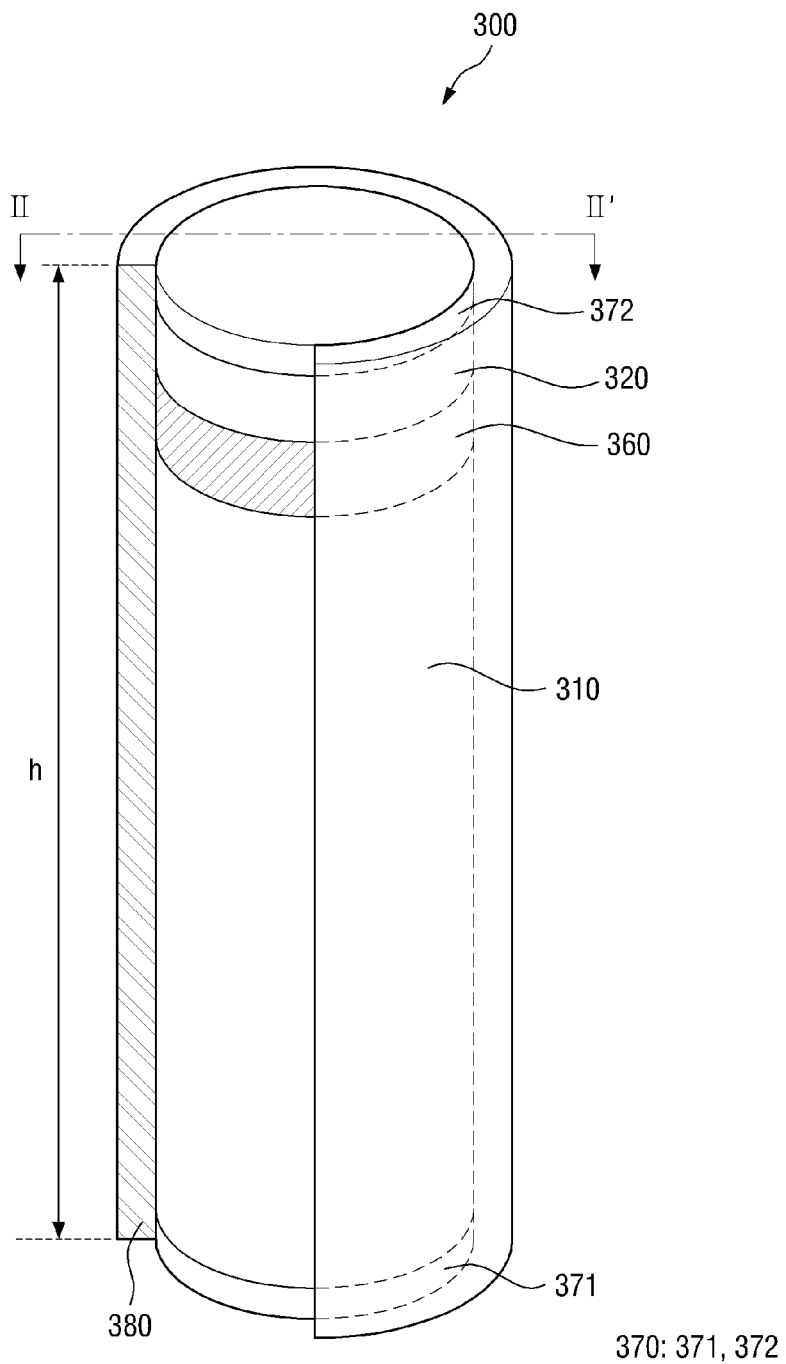
FIG. 1 is a schematic view of a light emitting element according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

As used herein, the singular forms, "a," "an," and "the" are intended to include the plural forms as well (and vice versa), unless the context clearly indicates otherwise.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish an element from another element. For instance, a first element discussed below could be termed a second element without departing from the teachings of the disclosure. Similarly, the second element could also be termed the first element.

In the specification and the claims, the phrase "at least one of" is intended to include the meaning of "at least one selected from the group of" for the purpose of its meaning and interpretation. For example, "at least one of A and B" may be understood to mean "A, B, or A and B." In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

It will be understood that the terms "connected to" or "coupled to" may include a physical or electrical connection or coupling.

"About", "approximately", and "substantially" are inclusive of the stated value and mean within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
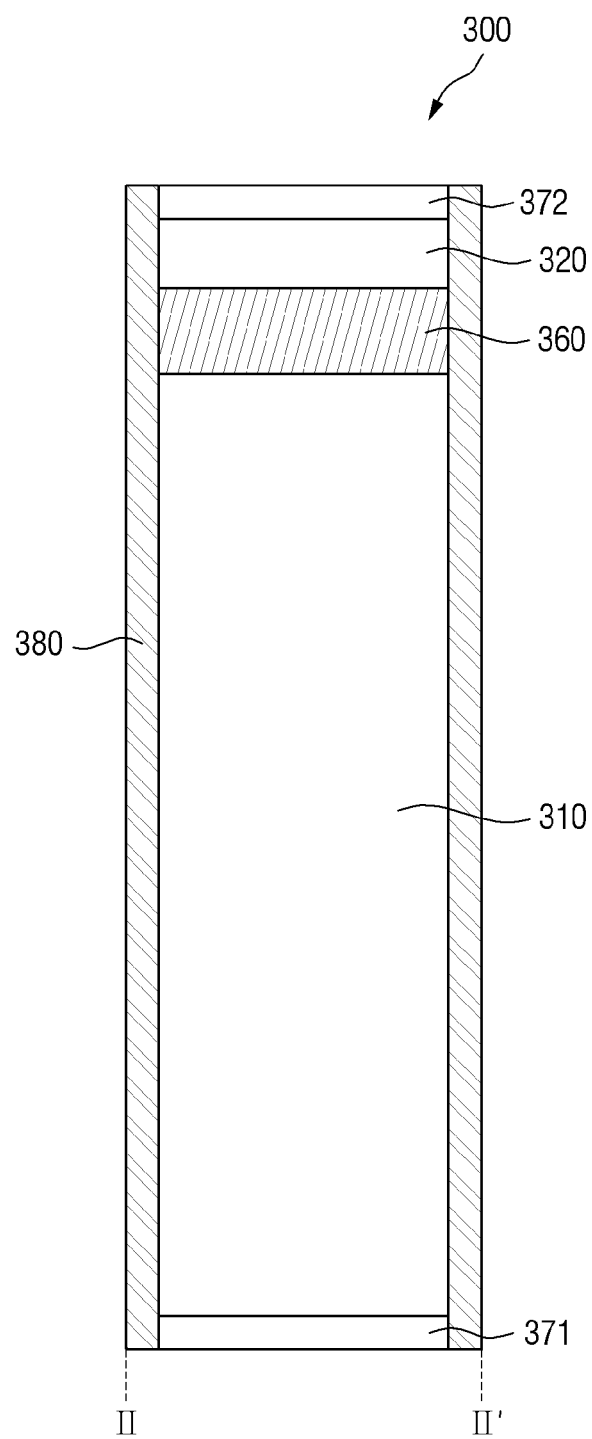
FIG. 2 is a schematic cross-sectional view of a light emitting element taken along line II-II' of FIG. 1.

FIG. 1 is a schematic view of a light emitting element according to an embodiment. FIG. 2 is a schematic cross-sectional view of a light emitting element taken along line II-II' of FIG. 1.

A light emitting element 300 may be a light emitting diode. Specifically, the light emitting element 300 may be an inorganic light emitting diode that has a micrometer or nanometer size, and may be made of an inorganic material. The inorganic light emitting diode may be aligned between two electrodes having polarity in case that an electric field is formed in a specific direction between two electrodes opposing each other. The light emitting element 300 may be aligned between two electrodes by the electric field generated between the electrodes.

The light emitting element 300 may have a shape extending in a direction. The light emitting element 300 may have a shape of a rod, wire, tube, or the like. In an embodiment, the light emitting element 300 may have a cylindrical or rod shape. However, the shape of the light emitting element 300 is not limited thereto, and the light emitting element 300 may have a polygonal prism shape such as a regular cube, a rectangular parallelepiped and a hexagonal prism, or may have various shapes such as a shape extending in a direction and having an outer surface partially inclined. Semiconductors included in the light emitting element 300 to be described later may have a structure in which they may be sequentially arranged or stacked on each other along the extension direction of the light emitting element.

The light emitting element 300 may include a semiconductor layer doped with any conductivity type (e.g., p-type or n-type) impurities. The semiconductor layer may emit light of a specific wavelength band by receiving an electrical signal applied from an external power source.

The light emitting element 300 according to an embodiment may emit light of a specific wavelength band. In an embodiment, an active layer 360 may emit blue light having a central wavelength band ranging from about 450 nm to about 495 nm. However, it should be understood that the central wavelength band of blue light is not limited to the above-mentioned range but includes all wavelength ranges that can be recognized as blue in the pertinent art. Further, the light emitted from the active layer 360 of the light emitting element 300 may not be limited thereto, and may be green light having a central wavelength band ranging from about 495 nm to about 570 nm, or red light having a central wavelength band ranging from about 620 nm to about 750 nm. Hereinafter, the description will be provided on the assumption that the light emitting element 300 emits blue light, for example.

Referring to FIG. 1 and FIG. 2, the light emitting element 300 according to an embodiment may include a first semiconductor layer 310, a second semiconductor layer 320, the active layer 360, a first electrode layer 371, a second electrode layer 372, and an insulating film 380.

The first semiconductor layer 310 may be, for example, an n-type semiconductor having a first conductivity type. For example, in case that the light emitting element 300 emits light of a blue wavelength band, the first semiconductor layer 310 may include a semiconductor material having a chemical formula of $Al_xGa_yIn_{1-x-y}N$ ($0 \leq x \leq 1$, $0 \leq y \leq 1$, $0 \leq x+y \leq 1$). For example, it may be at least one of n-type doped AlGaInN, GaN, AlGaN, InGaN, AlN and InN. The first semiconductor layer 310 may be doped with a first conductive dopant. For example, the first conductive dopant may be Si, Ge, Sn, or the like, or a combination thereof. In an embodiment, the first semiconductor layer 310 may be n-GaN doped with n-type Si. The length of the first semiconductor layer 310 may have a range of about 1.5 μm to about 5 μm, but is not limited thereto.

The second semiconductor layer 320 may be disposed on the active layer 360 to be described later. The second semiconductor layer 320 may be, by way of non-limiting example, a p-type semiconductor having a second conductivity type. For example, in case that the light emitting element 300 emits light of a blue or green wavelength band, the second semiconductor layer 320 may include a semiconductor material having a chemical formula of $Al_xGa_yIn_{1-x-y}N$ ($0 \leq x \leq 1$, $0 \leq y \leq 1$, $0 \leq x+y \leq 1$). For example, it may be at least one of p-type doped AlGaInN, GaN, AlGaN, InGaN, AlN and InN. The second semiconductor layer 320 may be doped with a second conductive dopant. For example, the second conductive dopant may be Mg, Zn, Ca, Se, Ba, or the like, or a combination thereof. In an embodiment, the second semiconductor layer 320 may be p-GaN doped with p-type Mg. The length of the second semiconductor layer 320 may have a range of about 0.05 μm to about 0.10 μm, but is not limited thereto.

Although it is illustrated in the drawing that the first semiconductor layer 310 and the second semiconductor layer 320 may be configured as a single layer, the disclosure is not limited thereto. According to some embodiments, depending on the material of the active layer 360, the first semiconductor layer 310 and the second semiconductor layer 320 may further include a larger number of layers, such as a cladding layer or a tensile strain barrier reducing (TSBR) layer. A description thereof will be given later with reference to other drawings.

The active layer 360 may be disposed between the first semiconductor layer 310 and the second semiconductor layer 320. The active layer 360 may include a material having a single or multiple quantum well structure. In case that the active layer 360 includes a material having a multiple quantum well structure, multiple quantum layers and well layers may be stacked on each other alternately. The active layer 360 may emit light by coupling of electron-hole pairs according to an electrical signal applied through the first semiconductor layer 310 and the second semiconductor layer 320. For example, in case that the active layer 360 emits light of a blue wavelength band, a material such as AlGaN or AlGaInN may be included. In particular, in case that the active layer 360 has a structure in which quantum layers and well layers may be alternately stacked on each other in a multiple quantum well structure, the quantum layer may include a material such as AlGaN or AlGaInN, and the well layer may include a material such as GaN or AlInN. In an embodiment, as described above, the active layer 360 includes AlGaInN as a quantum layer and AlInN as a well layer, and the active layer 360 may emit blue light having a central wavelength band of about 450 nm to about 495 nm.

However, the disclosure is not limited thereto, and the active layer 360 may have a structure in which semiconductor materials having large band gap energy and semiconductor materials having small band gap energy may be alternately stacked on each other, and may include other group III to V semiconductor materials according to the wavelength band of the emitted light. The light emitted by the active layer 360 is not limited to light of a blue wavelength band, but the active layer 360 may also emit light of a red or green wavelength band in some cases. The length of the active layer 360 may have a range of about 0.05 μm to about 0.10 μm, but is not limited thereto.

Light emitted from the active layer 360 may be emitted to side surfaces as well as the outer surface of the light emitting element 300 in a longitudinal direction. The directionality of the light emitted from the active layer 360 is not limited to one direction.

The electrode layer 370 may be an ohmic contact electrode. However, the disclosure is not limited thereto, and it may be a Schottky contact electrode. The electrode layer 370 may include the first electrode layer 371 and the second electrode layer 372. The first electrode layer 371 may be disposed on a bottom surface of the first semiconductor layer 310, and the second electrode layer 372 may be disposed on a top surface of the second semiconductor layer 320.

In case that the light emitting element 300 is electrically connected to an electrode or contact electrode in a display device 10 (see FIG. 20) according to an embodiment as will be described later, the electrode layer 370 may be capable of reducing resistance between the light emitting element 300 and the electrode or contact electrode. The electrode layer 370 may include a conductive metal. For example, the electrode layer 370 may include at least one of aluminum (Al), titanium (Ti), indium (In), gold (Au), silver (Ag), indium tin oxide (ITO), indium zinc oxide (IZO), and indium tin zinc oxide (ITZO). Further, the electrode layer 370 may include an n-type or p-type doped semiconductor material. The electrode layer 370 may include the same material or different materials, but is not limited thereto.

The insulating film 380 may be arranged to surround the outer surfaces of the semiconductor layers and electrode layers described above. In an embodiment, the insulating film 380 may be arranged to surround at least the outer surface of the active layer 360 and extend along the extension direction of the light emitting element 300. The insulating film 380 may function to protect the members. For example, the insulating film 380 may be formed to surround side surfaces of the members to expose both ends of the light emitting element 300 in the longitudinal direction.

In the drawing, although the insulating film 380 is illustrated to extend in the lengthwise direction of the light emitting element 300 to cover the side surfaces ranging from the first electrode layer 371 to the second electrode layer 372, the disclosure is not limited thereto. The insulating film 380 may cover the outer surface of only a part of the semiconductor layers, including the active layer 360, or may cover only a part of the outer surfaces of the first electrode layer 371 and the second electrode layer 372 to allow the outer surface of each electrode layer 370 to be partially exposed. Here, however, since the insulating film 380 may be formed to surround the first electrode layer 371 and the second electrode layer 372 after they may be formed in a manufacturing process for the light emitting element 300 to be described later, the insulating film 380 according to an embodiment may be disposed to surround outer side surfaces of the first electrode layer 371 and the second electrode layer 372 of the light emitting element 300.

Further, in some embodiments, the insulating film 380 may be formed to have a partially rounded outer surface in an area adjacent to at least one end of the light emitting element 300, for example, in an area surrounding the first electrode layer 371. This partially rounded portion may be formed as the insulating film 380 and may be partially etched in the manufacturing process for the light emitting element 300. A detailed description thereof will be given later with reference to other drawings.

The thickness of the insulating film 380 may have a range of about 10 nm to about 1.0 μm, but is not limited thereto. In an embodiment, the thickness of the insulating film 380 may be about 40 nm.

The insulating film 380 may include materials having insulating properties, for example, silicon oxide (SiOx), silicon nitride (SiNx), silicon oxynitride (SiOxNy), aluminum nitride (AlN), aluminum oxide (A2O3), and the like, or a combination thereof. Accordingly, it may be possible to prevent an electrical short circuit that may occur in case that the active layer 360 is in direct contact with the electrode through which the electrical signal may be transmitted to the light emitting element 300. Since the insulating film 380 protects the outer surface of the light emitting element 300 including the active layer 360, it may be possible to prevent degradation in luminous efficiency.

Further, in some embodiments, the insulating film 380 may have an outer surface which may be surface-treated. When the display device 10 is manufactured, the light emitting elements 300 may be aligned by being sprayed on the electrodes in a state of being dispersed in predetermined ink. Here, the surface of the insulating film 380 may be treated to have a hydrophobic property or hydrophilic property in order to keep the light emitting element 300 in the dispersed state without being aggregated with other neighboring light emitting elements 300 in the ink.

The light emitting element 300 may have a length h of about 1 μm to about 10 μm or about 2 μm to about 6 μm, and in an embodiment, about 3 μm to about 5 μm. Further, a diameter of the light emitting element 300 may have a range of about 300 nm to about 700 nm, and an aspect ratio of the light emitting element 300 may be about 1.2 to about 100. However, the disclosure is not limited thereto, and the light emitting elements 300 included in the display device 10 may have different diameters according to a difference in composition of the active layer 360. In an embodiment, the diameter of the light emitting element 300 may have a range of about 500 nm.

The light emitting element 300 may be manufactured by growing a semiconductor crystal through epitaxial growth. The light emitting element 300 may be manufactured by growing the first semiconductor layer 310, the active layer 360 and the second semiconductor layer 320 in sequence on an underlying substrate. Here, however, since the first semiconductor layer 310 may not grow on the first electrode layer 371 disposed on the bottom surface thereof, the first electrode layer 371 may be formed on the bottom surface of the semiconductor layer 310 after the semiconductor layers may be grown. According to an embodiment, the manufacturing method for the light emitting element 300 may include processes of forming the semiconductor layers, separating these semiconductor layers from the underlying substrate, and forming the first electrode layer 371. The light emitting element 300 may be manufactured by performing the separation process of separating the grown semiconductor layers from the underlying substrate at least twice.

Hereinafter, a method of manufacturing the light emitting element 300 according to an embodiment will be described.

Figure 3:
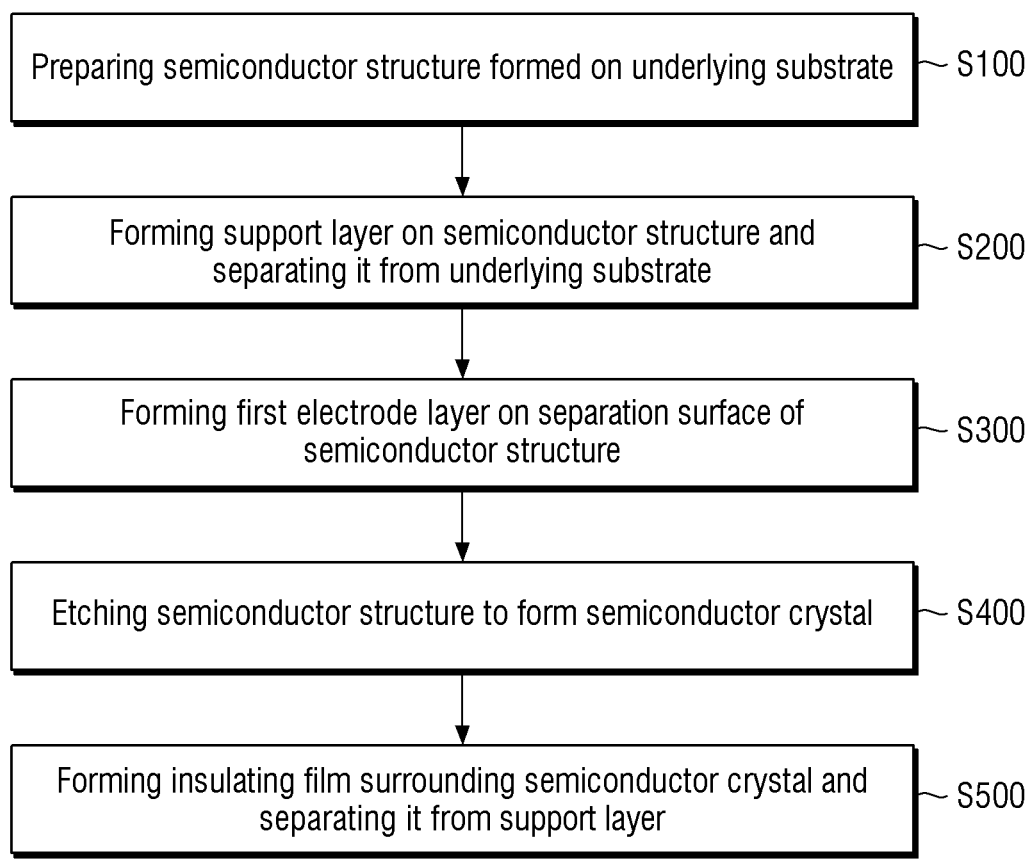
FIG. 3 is a schematic flowchart showing a method of manufacturing a light emitting element according to an embodiment.

FIG. 3 is a schematic flowchart showing a method of manufacturing a light emitting element according to an embodiment. FIG. 4 to FIG. 14 are schematic diagrams illustrating the method of manufacturing the light emitting element according to an embodiment.

Figure 5:
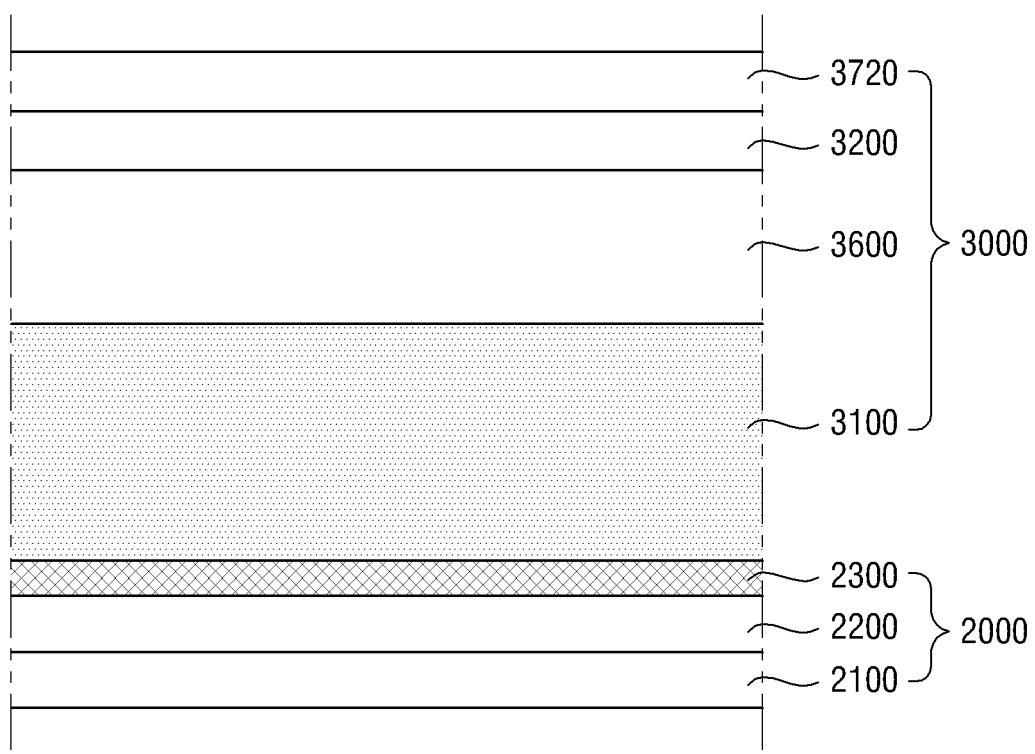
Figure 6:
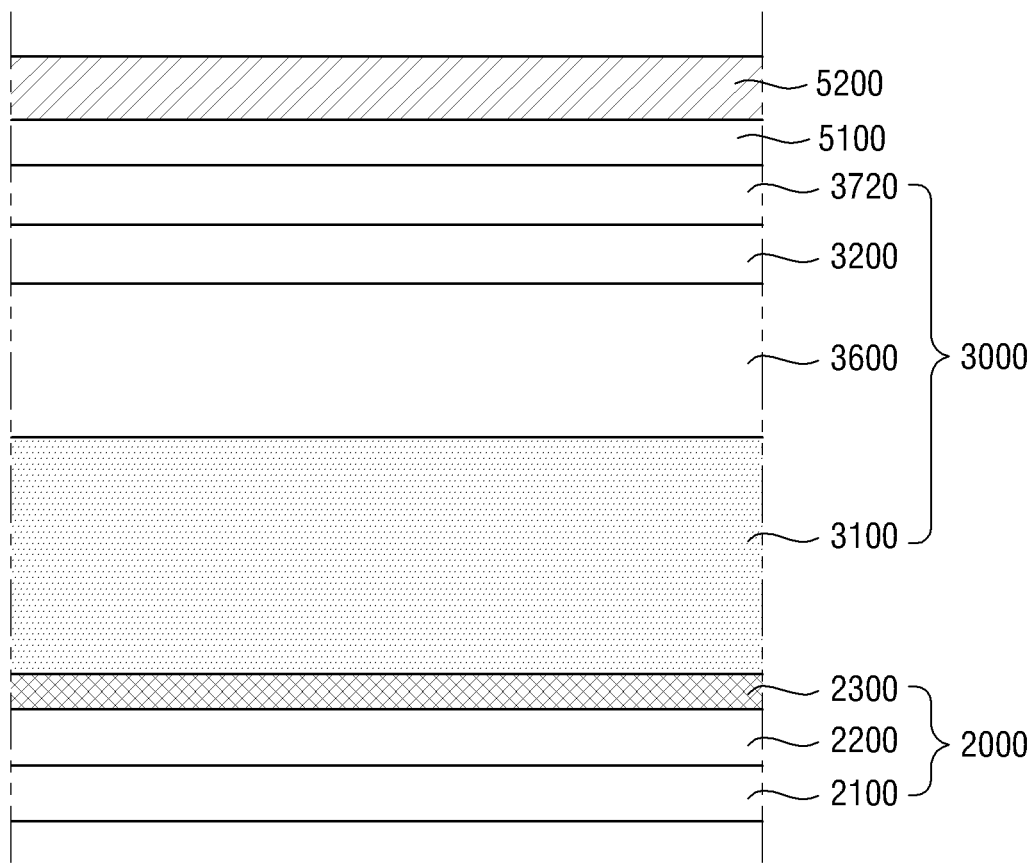

The method of manufacturing the light emitting element 300 according to an embodiment may include a first separation step of separating a semiconductor structure 3000 (see FIG. 5) formed on an underlying substrate 2000 (see FIG. 5); an etching step of forming a first electrode material layer on a surface of the semiconductor structure 3000 and etching it in a direction; and a second separation step of separating a semiconductor rod ('ROD' in FIG. 13) including semiconductor layers 310 and 320, an active layer 360, an electrode layer 370 and an insulating film 380 from a support layer 5200 (see FIG. 6). The light emitting element 300 having a structure in which multiple layers may be stacked on top of each other may be manufactured by stacking the first semiconductor layer 310, the active layer 360, the second semiconductor layer 320, and so forth in sequence. Here, however, the order in which the multiple layers may be stacked on each other may be different from the aforementioned example, and the first electrode layer 371 disposed on the bottom surface of the first semiconductor layer 310 may be formed later than the second electrode layer 372. The method of manufacturing the light emitting element 300 according to an embodiment may include the first separation step of forming the semiconductor structure 300 and separating it; the etching step of etching the semiconductor structure 3000; and the second separation step of separating the semiconductor rod ROD formed through these processes.

Figure 4:
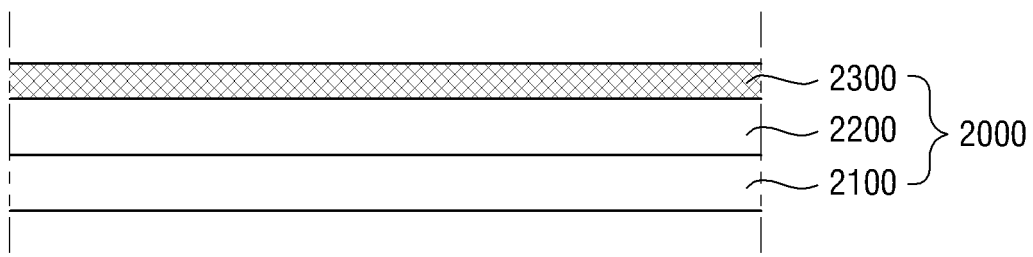
FIG. 4 to FIG. 14 are schematic diagrams illustrating a method of manufacturing the light emitting element according to an embodiment.

The method of manufacturing the light emitting element 300 according to an embodiment will be elaborated. First, as shown in FIG. 4, the underlying substrate 2000 including a base substrate 2100, a buffer material layer 2200 formed on the base substrate 2100, and a separation layer 2300 formed on the buffer material layer 2200 may be prepared. The underlying substrate 2000 may have a structure in which the base substrate 2100, the buffer material layer 2200, and the separation layer 2300 may be stacked in sequence.

The base substrate 2100 may include a transparent substrate such as a sapphire (Al2O3) substrate and a glass substrate. However, the disclosure is not limited thereto, and it may be formed of a conductive substrate such as GaN, SiC, ZnO, Si, GaP, and GaAs, or a combination thereof. The following description is directed to a case where the base substrate 2100 is a sapphire (Al2O3) substrate. Although not limited, the base substrate 2100 may have, for example, a thickness in a range of about 400 μm to about 1500 μm.

Semiconductor layers may be formed on the base substrate 2100. The semiconductor layers grown by an epitaxial method may be formed by growing seed crystals. Here, the semiconductor layer may be formed using at least one of electron beam deposition, physical vapor deposition (PVD), chemical vapor deposition (CVD), plasma laser deposition (PLD), dual-type thermal evaporation, sputtering, and metal organic chemical vapor deposition (MOCVD), in an embodiment, using the metal organic chemical vapor deposition (MOCVD). However, the disclosure is not limited thereto.

A precursor material for forming the semiconductor layers may be selected to form a target material in a selectable range without any limitation. For example, the precursor material may be a metal precursor including an alkyl group such as a methyl group or an ethyl group. Examples of the precursor material may include, but are not limited to, trimethylgallium Ga(CH3)3, trimethylaluminum Al(CH3)3, and triethyl phosphate (C2H5)3PO4. Hereinafter, with the omission of the description of the method and processing conditions for forming the semiconductor layers, a description is made of the processing order of the method for manufacturing the light emitting element 300 and the layered structure of the light emitting element 300 in detail.

The buffer material layer 2200 may be formed on the base substrate 2100. Although it is shown in the drawing that one buffer material layer 2200 may be deposited, the disclosure is not limited thereto, and multiple layers may be formed. The buffer material layer 2200 may be disposed to reduce a difference in lattice constants between a first semiconductor 3100 and the base substrate 2100.

For example, the buffer material layer 2200 may include an undoped semiconductor, and may be a material including substantially the same material as the first semiconductor layer 3100 and neither n-type doped nor p-type doped. In an embodiment, the buffer material layer 2200 may be, but is not limited to, at least one of undoped InAlGaN, GaN, AlGaN, InGaN, AlN, and InN. The buffer material layer 2200 may also be omitted depending on the base substrate 2100. The following description will be given for an example where the buffer material layer 2200 including an undoped semiconductor may be formed on the base substrate 2100.

The separation layer 2300 may be disposed on the buffer material layer 2200. The separation layer 2300 may include a material that allows crystals of the first semiconductor 3100 to grow smoothly. The separation layer 2300 may include at least one of an insulating material and a conductive material. As an example, the separation layer 2300 may include silicon oxide (SiOx), silicon nitride (SiNx), silicon oxynitride (SiOxNy), or the like, or a combination thereof as an insulating material, and may include ITO, IZO, IGO, ZnO, graphene, graphene oxide, or the like, or a combination thereof as a conductive material. However, embodiments are not limited thereto.

The separation layer 2300 may be removed in a process to be described later, and, accordingly, the semiconductor structure 3000 formed on the separation layer 2300 may be separated from the underlying substrate 2000. The removing of the separation layer 2300 may be accomplished by a chemical lift-off (CLO) method, and, accordingly, the bottom surface of the first semiconductor 3100 may be flat, the same as the surface of the separation layer 2300.

As shown in FIG. 5, the semiconductor structure 3000 may be formed on the underlying substrate 2000 (S100). The semiconductor structure 3000 may include the first semiconductor 3100, an active layer 3600, a second semiconductor 3200, and a second electrode material layer 3720, and it may be formed on the separation layer 2300. The material layers included in the semiconductor structure 3000 may be formed by performing the processes as stated above, and the layers included in the semiconductor structure 3000 may correspond to the respective layers included in the light emitting element 300 according to an embodiment. For example, the material layers may include the same materials as the first semiconductor layer 310, the active layer 360, the second semiconductor layer 320, and the second electrode layer 372 of the light emitting element 300. Here, however, the semiconductor structure 3000 of FIG. 5 may not have a layer corresponding to the first electrode layer 371 of the light emitting element 300.

According to an embodiment, the first electrode layer 371 of the light emitting element 300 may be formed after a surface of the first semiconductor 3100 may be exposed by performing the first separation step of separating the semiconductor structure 3000 from the underlying substrate 2000.

The first separation step of separating the semiconductor structure 3000 from the underlying substrate 2000 may be performed, and a first electrode material layer 3710 may be formed on the surface of the first semiconductor 3100 separated from the underlying substrate 2000. According to an embodiment, the formation of the first electrode material layer 3710 may include a process of forming an adhesive layer 5100 and the support layer 5200 on the semiconductor structure 3000; and a process of removing the separation layer 2300 of the underlying substrate 2000 to separate the semiconductor substrate 3000 from the underlying substrate 2000, and forming the first electrode material layer 3710 on the surface of the first semiconductor 3100.

Referring to FIG. 6, the adhesive layer 5100 and the support layer 5200 may be formed on the semiconductor structure 3000 (S200). The adhesive layer 5100 may be formed on a top surface of the semiconductor structure 3000, that is, on top of the second electrode material layer 3720, and the support layer 5200 may be formed on a top surface of the adhesive layer 5100. The support layer 5200 may function to support the semiconductor structure 3000 in case that it is separated in a subsequent process. The adhesive layer 5100 may fix the semiconductor structure 3000 to the support layer 5200. As will be described later, the semiconductor structure 3000 may be formed into the semiconductor rod ROD on the adhesive layer 5100, and the semiconductor rod ROD may be formed into the light emitting element 300 as they may be separated from the adhesive layer 5100 in a physical or chemical manner.

The support layer 5200 may perform the same function as the base substrate 2100 in the etching step and the second separation step performed after the first separation step. The support layer 5200 may include a material having higher strength than the adhesive layer 5100, and in some embodiments, the support layer 5200 may be implemented by, but not limited to, a thermal release tape (TRT), polyethylene terephthalate (PET), a plastic film, or the like, or a combination thereof. However, the disclosure is not limited thereto.

The adhesive layer 5100 may serve to fix the semiconductor structure 3000 or the semiconductor rod ROD to the support layer 5200. The adhesive layer 5100 may include an organic material having adhesive strength, and in some embodiments, the adhesive layer 5100 may include at least one of poly methyl methacrylate (PMMA), photoresist (PR), and poly(3,4-ethylenedioxythiophene) polystyrene sulfonate (PEDOT:PSS). However, embodiments are not limited thereto.

The semiconductor structure 3000 may be formed on the support layer 5200 and the adhesive layer 5100 through the first separation step, and the etching step and the second separation step may be performed thereafter.

Figure 7:
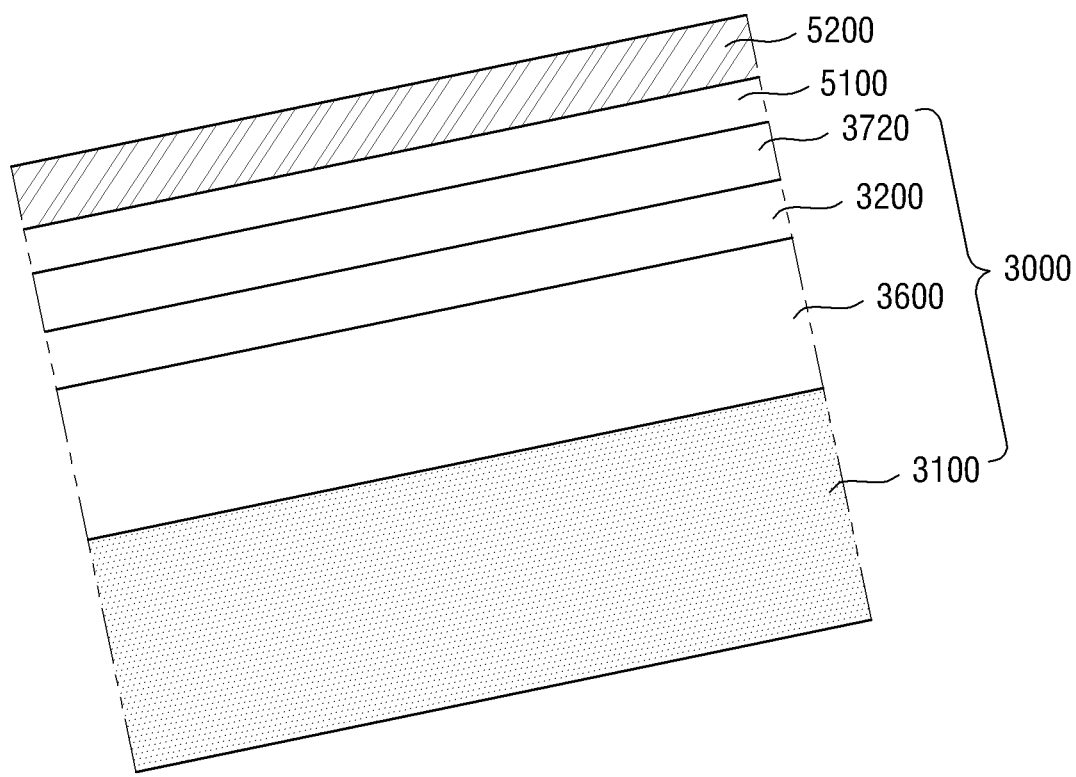
Figure 7:
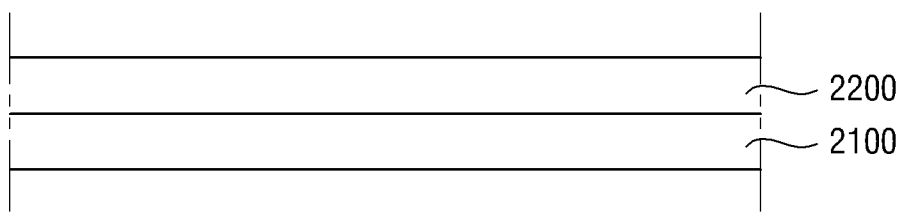

As depicted in FIG. 7, the first separation step of removing the separation layer 2300 to separate the semiconductor structure 3000 from the underlying substrate 2000 may be performed. The removal of the separation layer 2300 may be accomplished by a chemical lift-off (CLO) method. In some embodiments, the separation layer 2300 may be removed by a wet etching process using a separating etching liquid such as buffered oxide etch (BOE) or hydrofluoric acid (HF), but is not limited thereto.

The semiconductor structure 3000 may be separated from the underlaying substrate 2000 as the separation layer 2300 may be removed, and may be formed on the support layer 5200 with the adhesive layer 5100 therebetween. In the separated semiconductor structure 3000, the second electrode material layer 3720, the second semiconductor 3200, the active layer 3600, and the first semiconductor 3100 may be arranged in sequence from the top surface of the support layer 5200, and a surface of the first semiconductor 3100, that is, the separation surface thereof separated from the underlying substrate 2000 may be exposed.

Figure 8:
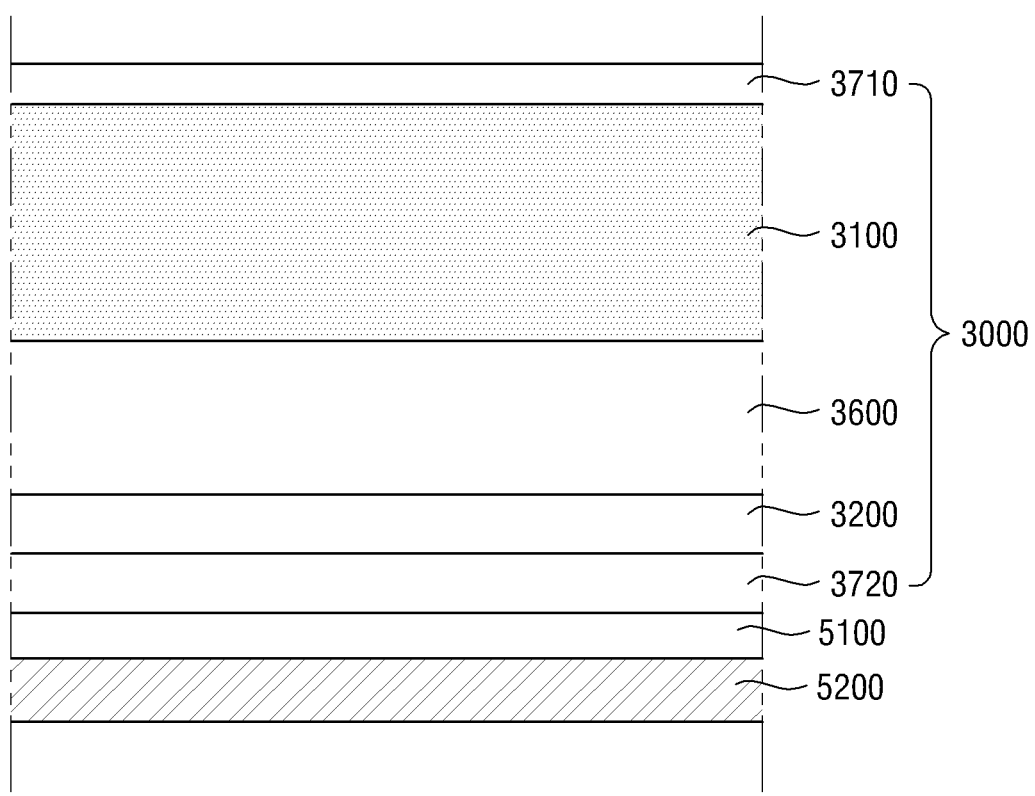

Subsequently, as shown in FIG. 8, the first electrode material layer 3710 may be formed on the separation surface which may be the surface of the first semiconductor 3100 of the semiconductor structure 3000 (S300). The first electrode material layer 3710 may be formed in the same way as the aforementioned second electrode material layer 3720. The first electrode material layer 3710 may correspond to the first electrode layer 371 of the light emitting element 300, and may include the same material as the first electrode layer 371. The light emitting element 300 may be manufactured by stacking the multiple layers including the semiconductor layers and the active layer in sequence through the epitaxial growth method, starting from the first semiconductor layer 310. Here, however, the first electrode layer 371 disposed on the bottom surface of the first semiconductor 310 may be formed after the semiconductor structure 3000 may be separated from the underlying substrate 2000 after the formation of the second electrode material layer 3720. For example, the method of manufacturing the light emitting element 300 according to an embodiment may involve forming the multiple layers stacked from the first semiconductor layer 310 in sequence, and forming the first electrode layer 371 after the second electrode layer 372 may be formed.

Thereafter, a semiconductor crystal 3000' may be formed by etching the semiconductor structure 3000 with the first electrode material layer 3710 thereon in a direction perpendicular to the support layer 5200. The light emitting element 300 may have a shape extending in a direction, and the semiconductor structure 3000 may be etched in this direction to form the semiconductor crystal 3000'. The formation of the semiconductor crystal 3000' may include an etching process. In some embodiments, the formation of the semiconductor crystal 3000' may include forming an etching mask layer 1600 and an etching pattern layer 1700 on the semiconductor structure 3000; etching the semiconductor structure 3000 according to a pattern of the etching pattern layer 1700; and removing the etching mask layer 1600 and the etching pattern layer 1700.

Figure 9:
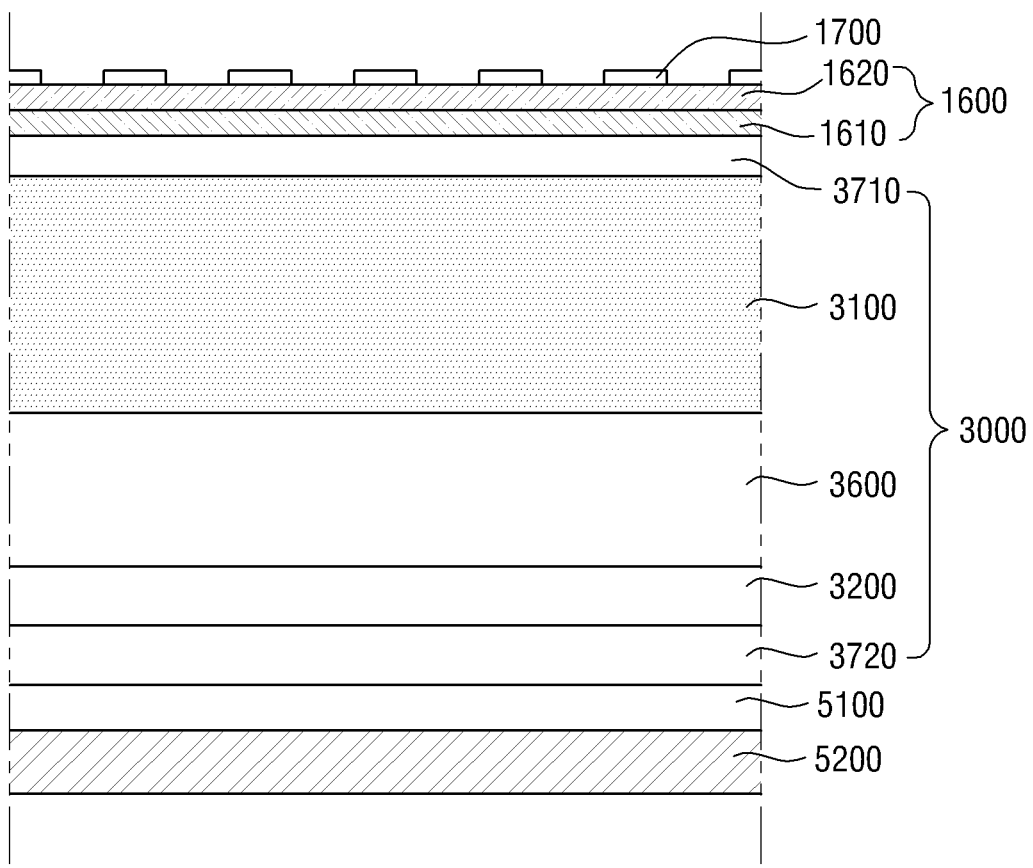

Referring to FIG. 9, the etching mask layer 1600 may be formed on the first electrode material layer 3710, and the etching pattern layer 1700 may be formed on the etching mask layer 1600. The etching mask layer 1600 may serve as a mask for etching the multiple layers of the semiconductor structure 3000 consecutively. The etching mask layer 1600 may include a first etching mask layer 1610 including an insulating material and a second etching mask layer 1620 including metal.

The first etching mask layer 1610 may include an oxide or nitride as the insulating material. Examples of the insulating material may include silicon oxide (SiOx), silicon nitride (SiNx), silicon oxynitride (SiOxNy), or a combination thereof. The first etching mask layer 1610 may have a thickness in a range of about 0.5 μm to about 1.5 μm, but is not limited thereto.

The second etching mask layer 1620 may be disposed on the first etching mask layer 1610. For example, the second etching mask layer 1620 may be a hard mask layer. The second etching mask layer 1620 may include a material capable of acting as the mask for the consecutive etching of the semiconductor structure 3000. For example, it may include metal such as, but not limited to, chrome (Cr). The second etching mask 1620 may have a thickness in a range from about 30 nm to about 150 nm, but is not limited thereto.

The etching pattern layer 1700 may be disposed on the etching mask layer 1600. The etching pattern layer 1700 may include one or more patterns spaced apart from each other, and may serve as the mask for the consecutive etching of the semiconductor structure 3000. The etching pattern layer 1700 may include polymer, polystyrene sphere, silica sphere, or the like, or a combination thereof, but the material of the etching pattern 1700 is not particularly limited as long as the material may be suitable for forming the pattern.

For example, in the case where the etching pattern layer 1700 includes a polymer, it may be possible to employ a method for forming a pattern with the polymer. For example, it may be possible to use a method such as photolithography, e-beam lithography, nanoimprint lithography, or a combination thereof to form the etching pattern layer 1700 including the polymer.

In an embodiment, the etching pattern layer 1700 may be formed by nanoimprint lithography, and a nanopattern of the etching pattern layer 1700 may include nanoimprint resin. The resin may include a fluorinated monomer, an acrylate monomer, dipentaerythritol hexaacrylate, dipropylene glycol diacrylate, poly(ethylene glycol) phenyletheracrylate, butylated hydroxy toluene (BHT), 1-hydroxycyclohexyl phenyl ketone (Irgacure 184), or the like, or a combination thereof, but is not limited thereto.

Figure 10:
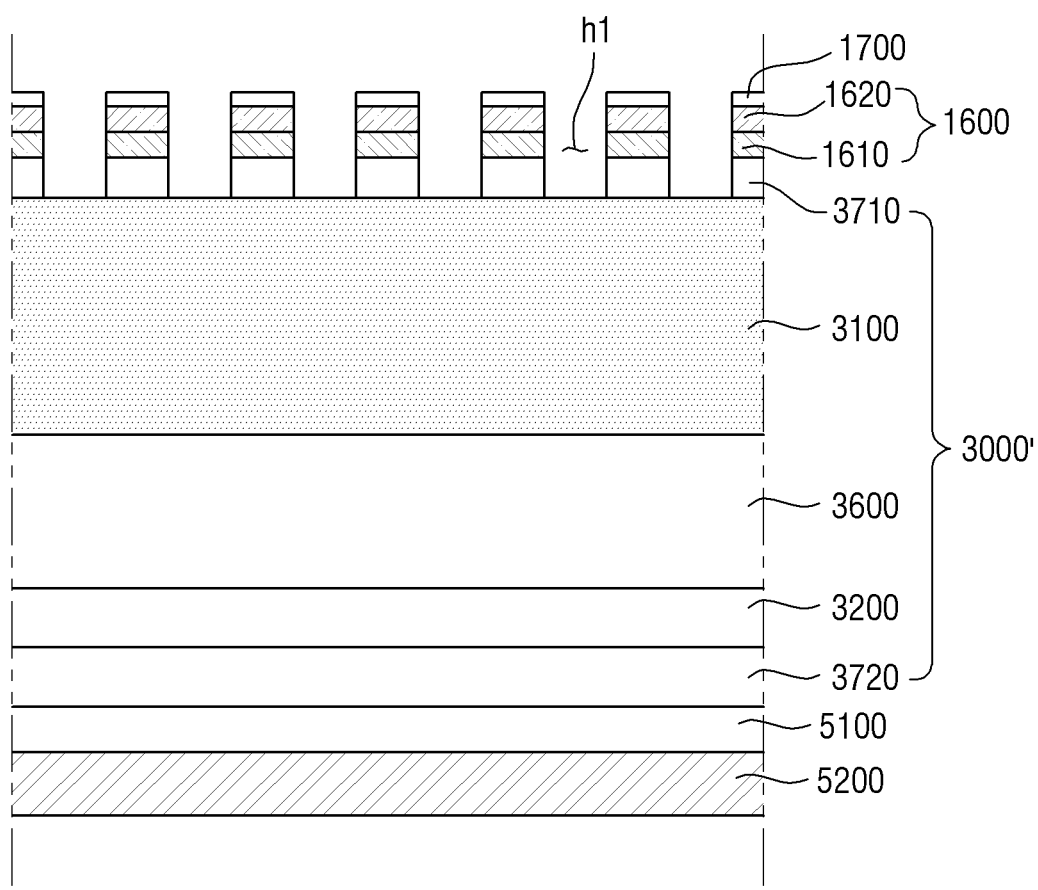

Thereafter, as illustrated in FIG. 10, the semiconductor structure 3000 may be etched according to the etching pattern layer 1700 to form the semiconductor crystal 3000' (S400). The method of manufacturing the light emitting element 300 according to an embodiment may include etching the semiconductor structure 3000 in the direction perpendicular to the support layer 5200, starting from the top surface of the first electrode material layer 3710. Since the semiconductor crystal 3000' may be formed by etching the semiconductor structure 3000 with the first electrode material layer 3710 thereon in the direction, an insulating coating film 3800 formed to surround an outer surface of the semiconductor crystal 3000' as will be described later may be formed on an outer surface of the first electrode layer 371 as well. Accordingly, the insulating film 380 of the light emitting element 300 may be formed on an outer side surface of the first electrode layer 371 as well.

The light emitting element 300 may be formed by etching the semiconductor structure 3000 in a direction opposite to the direction in which the first electrode layer 371, the first semiconductor layer 310, and the active layer 360 may be arranged in sequence. In some embodiments, the diameter of the semiconductor crystal 3000' may vary depending on the direction in which the semiconductor structure 3000 may be etched. For example, referring to FIG. 8, as the semiconductor structure 3000 may be etched from the top surface of the first electrode material layer 3710 in the direction perpendicular to the support layer 5200, the diameter of the semiconductor crystal 3000' may increase going toward the second electrode material layer 3720 located at the lower side. A description thereof will be given later with reference to other drawings.

The formation of the semiconductor crystal 3000' may include a first etching step of forming a first etch hole h1 by etching the etching mask layer 1600 and the first electrode material layer 3710 in the direction perpendicular to the support layer 5200 along a gap between the patterns of the etching pattern layer 1700; a step of removing the etching pattern layer 1700; a second etching step of forming a second etch hole h2 by etching the multiple layers from the first semiconductor 3100 to the second electrode material layer 3720 along the first etch hole h1; and a step of removing the etching mask layer 1600.

The etching of the semiconductor structure 3000 may be carried out by a method. For example, the etching process may be performed with dry etching, wet etching, reactive ion etching (RIE), inductively coupled plasma reactive ion etching (ICP-RIE), or the like, or a combination thereof. The dry etching may be suitable for vertical etching as it enables anisotropic etching. In the case of using the aforementioned etching technique, it may be possible to use Cl2 or O2 as an etchant. However, embodiments are not limited thereto.

In some embodiments, etching the semiconductor structure 3000 may be carried out with a combination of the dry etching and the wet etching. For example, it may be possible to perform etching in a depth direction with the dry etching and anisotropic etching with the wet etching such that the etched sidewalls may be placed on the plane perpendicular to the surface.

Figure 11:
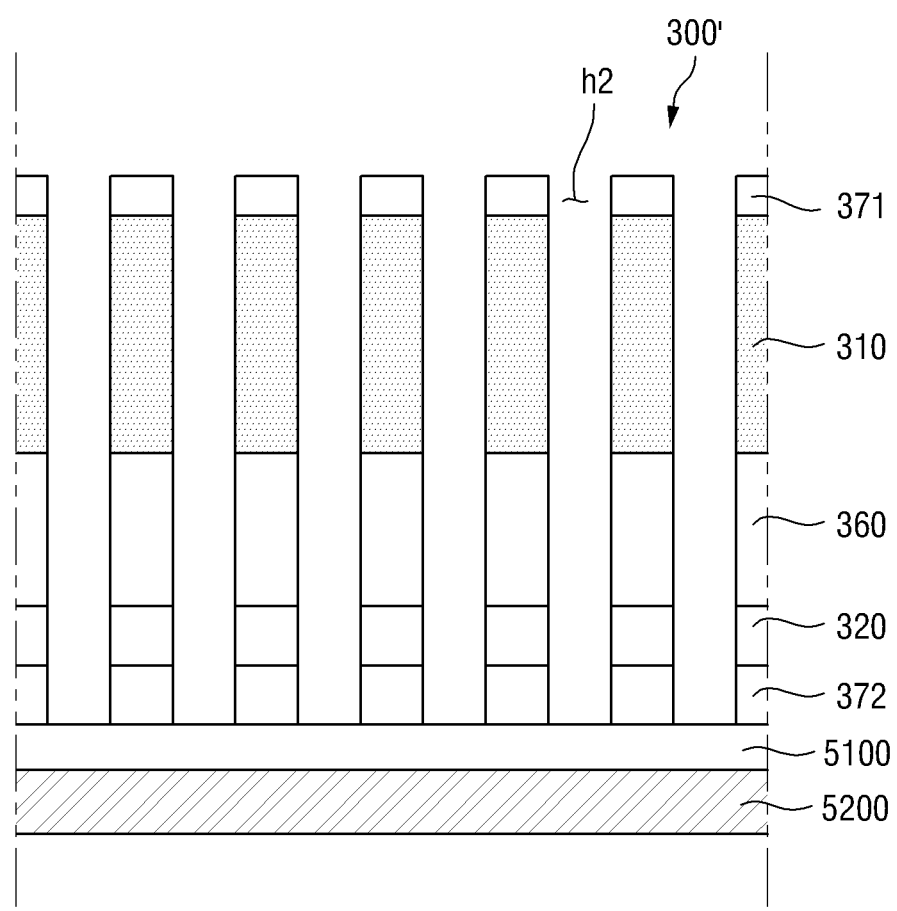

Referring to FIG. 10 and FIG. 11, there may be performed the first etching step of etching the etching mask layer 1600 and the first electrode material layer 3710 along the gap between the patterns of the etching pattern layer 1700 to form the first etch hole h1. The first etch hole h1 may be formed as the etching pattern layer 1700, the etching mask layer 1600 and the first electrode material layer 3710 may be removed. The first etch hole h1 may allow the separation surface of the first semiconductor 3100 to be exposed therethrough. There may be performed the second etching step of etching the multiple layers from the first semiconductor 3100 to the second electrode material layer 3720 along the first etch hole h1 to form the second etch hole h2. In the drawings, although the first etching step and the second etching step are illustrated to be performed as separate processes, the disclosure is not limited thereto. The first etching step and the second etching step may be performed consecutively in a single process. The semiconductor crystal 3000' formed by the etching of the semiconductor structure 3000 may include a first electrode layer 371, a first semiconductor layer 310, the active layer 360, a second semiconductor layer 320, and a second electrode layer 372, the same as the light emitting element 300 according to an embodiment.

By removing the etching mask layer 1600 and the etching pattern layer 1700, the semiconductor crystal 3000' may be formed. The removal of the etching mask layer 1600 or the etching pattern layer 1700 may be carried out by a process. For example, this process may be reactive ion etching (ME), inductively coupled plasma reactive ion etching (ICP-RIE), or the like, or a combination thereof. However, the disclosure is not limited thereto.

Thereafter, by forming an insulating film 380 which partially surrounds an outer side surface of the semiconductor crystal 3000', the semiconductor rod ROD may be formed.

Figure 12:
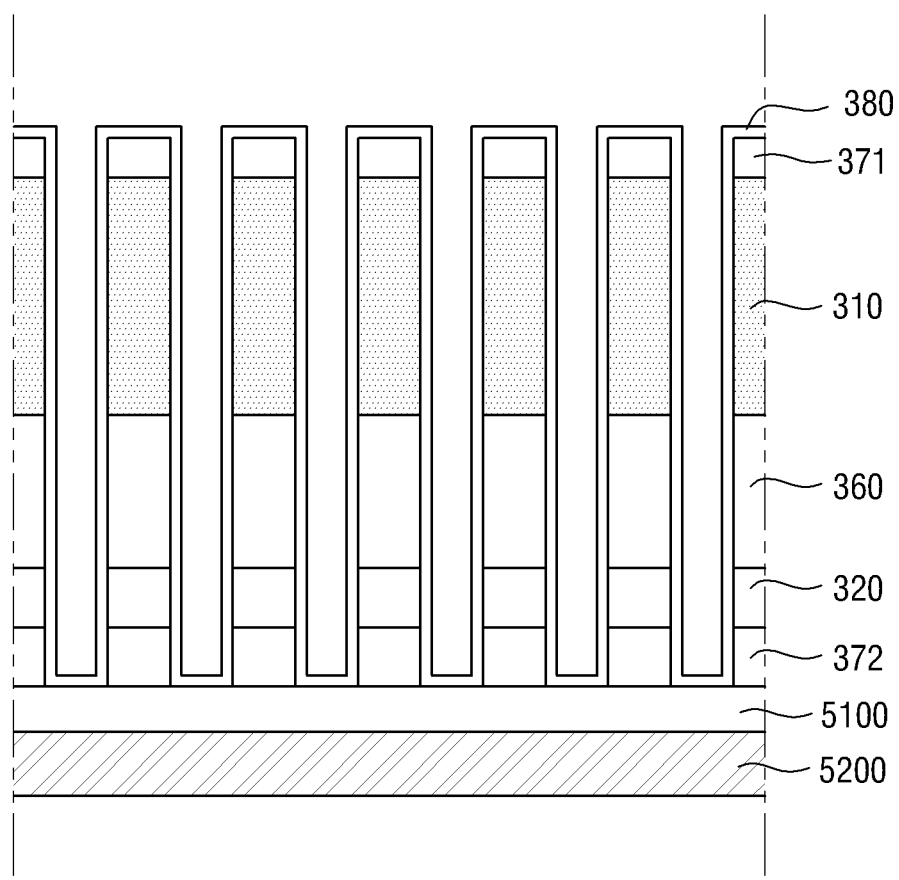
Figure 13:
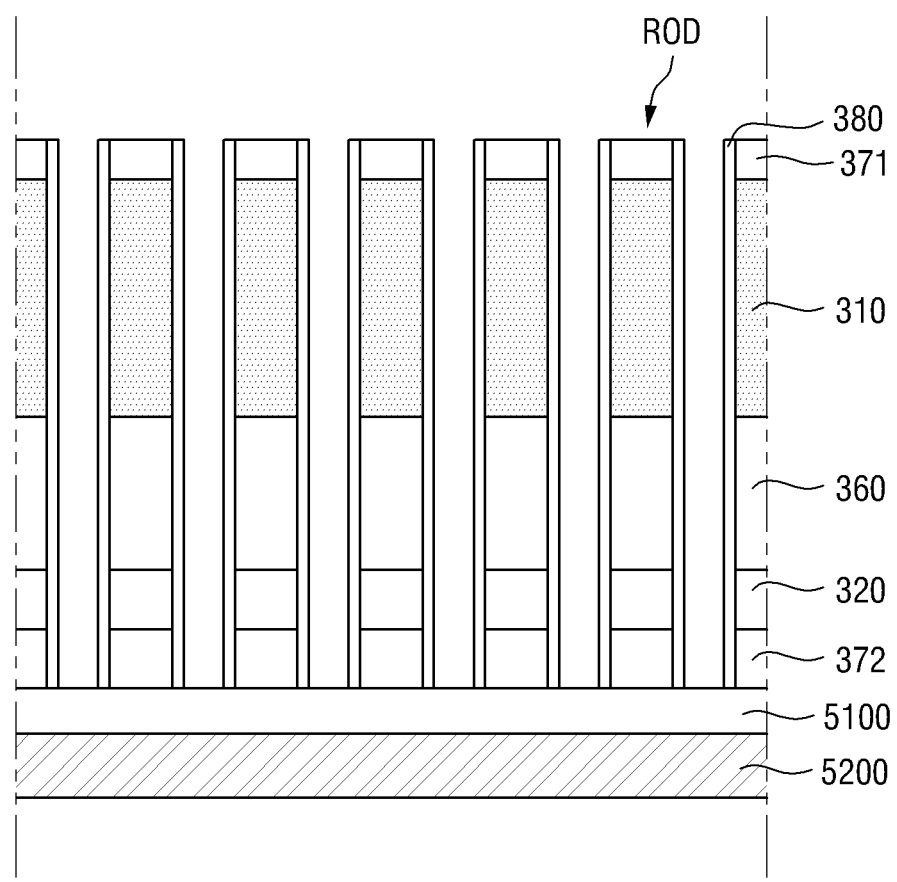

Referring to FIGS. 12 and 13, the insulating film 380 may be formed by forming the insulating coating film 3800 surrounding the outer surface of the semiconductor crystal 3000' and removing the insulating coating film 3800 partially such that a top surface of the first electrode layer 371 may be exposed (S500). Since the insulating coating film 3800 may be formed on the outer surface of the semiconductor crystal 3000' having the first electrode layer 371, the insulating film 380 of the light emitting element 300 may be formed on an outer side surface of the first electrode layer 371 as well.

The insulating coating film 3800 may be an insulating material formed on the outer surface of the semiconductor rod ROD, and it may be formed by coating or immersing the insulating material on the outer surface of the semiconductor crystal 3000'. However, embodiments are not limited thereto. For example, the insulating coating film 3800 may be formed using atomic layer deposition (ALD).

The insulating coating film 3800 may also be formed on a side surface and a top surface of the semiconductor crystal 3000' and on the adhesive layer 5100 exposed in an area between semiconductor crystals 3000'. The insulating coating film 3800 may be partially removed such that the top surface of the first electrode layer 371 may be exposed. The partial removal of the insulating coating film 3800 may be carried out by etch-back or dry etching as anisotropic etching. It is illustrated in the drawings that a top surface of the insulating coating film 3800 may be removed to expose the first electrode layer 371, and a top surface of the insulating film 380 is shown to be flat. However, the disclosure is not limited thereto. In some embodiments, the insulating film 380 may be formed to have a partially curved outer surface in an area where it surrounds the first electrode layer 371. In the process of partially removing the insulating coating film 3800, a side surface of the insulating coating film 3800 as well as the top surface thereof may be partially removed, so that the insulating film 380 surrounding the multiple layers may be formed with a partially etched end surface. Particularly, as the top surface of the insulating coating film 3800 may be removed, an outer surface of the insulating film 380 adjacent to the first electrode layer 371 may be partially removed in the light emitting element 300. A description thereof may refer to other embodiments.

Figure 14:
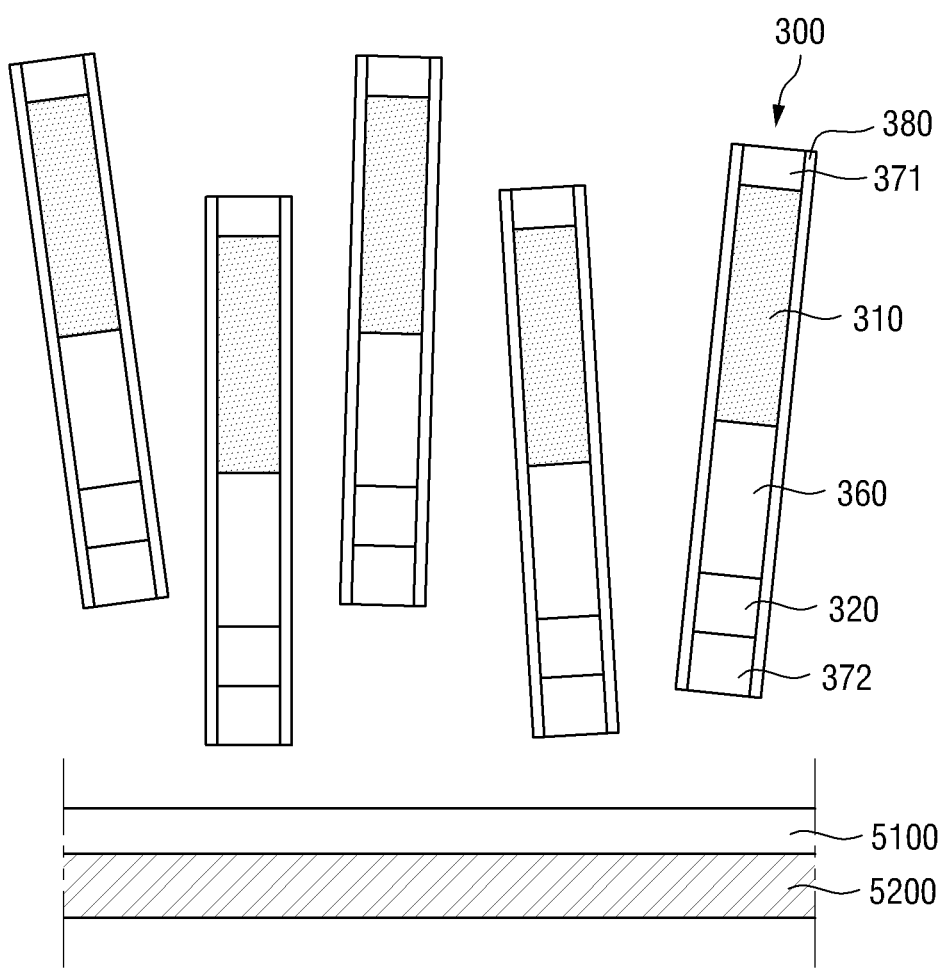

Finally, the second separation step of separating the semiconductor rod ROD as shown in FIG. 14 may be performed to thereby obtain the light emitting element 300 (S500). The second separation step may be carried out by separating the semiconductor rod ROD from the adhesive layer 5100 physically or by removing the adhesive layer 5100 chemically. The drawing illustrates an example where the semiconductor rod ROD may be removed from the adhesive layer 5100 physically, allowing the adhesive layer 5100 to be left on the support layer 5200. However, without being limited thereto, the semiconductor rod ROD may be separated from the support layer 5200 by removing the adhesive layer 5100. A detailed description thereof will be omitted.

Through the above-described processes, the light emitting element 300 according to an embodiment may be manufactured. The method of manufacturing the light emitting element 300 may include the first separation step of separating the semiconductor structure 3000 from the underlying substrate 2000, and the second separation step of separating the semiconductor rod ROD from the adhesive layer 5100. The multiple layers of the light emitting element 300 may be formed in sequence along the stacking direction thereof starting from the first semiconductor layer 310, and the first electrode layer 371 may be formed after the first separation step. To form the light emitting element 300 extending in a direction, the semiconductor structure 3000 may be etched from the top surface of the first electrode material layer 3710 in the direction to thereby form the semiconductor crystal 3000'. Further, since the process of etching the semiconductor structure 3000 in the direction may be performed after forming the first electrode material layer 3710, the insulating film 380 of the light emitting element 300 according to an embodiment may be formed on the outer side surface of the first electrode layer 371 as well.

Hereinafter, the light emitting element 300 according to other embodiments will be described.

Figure 15:
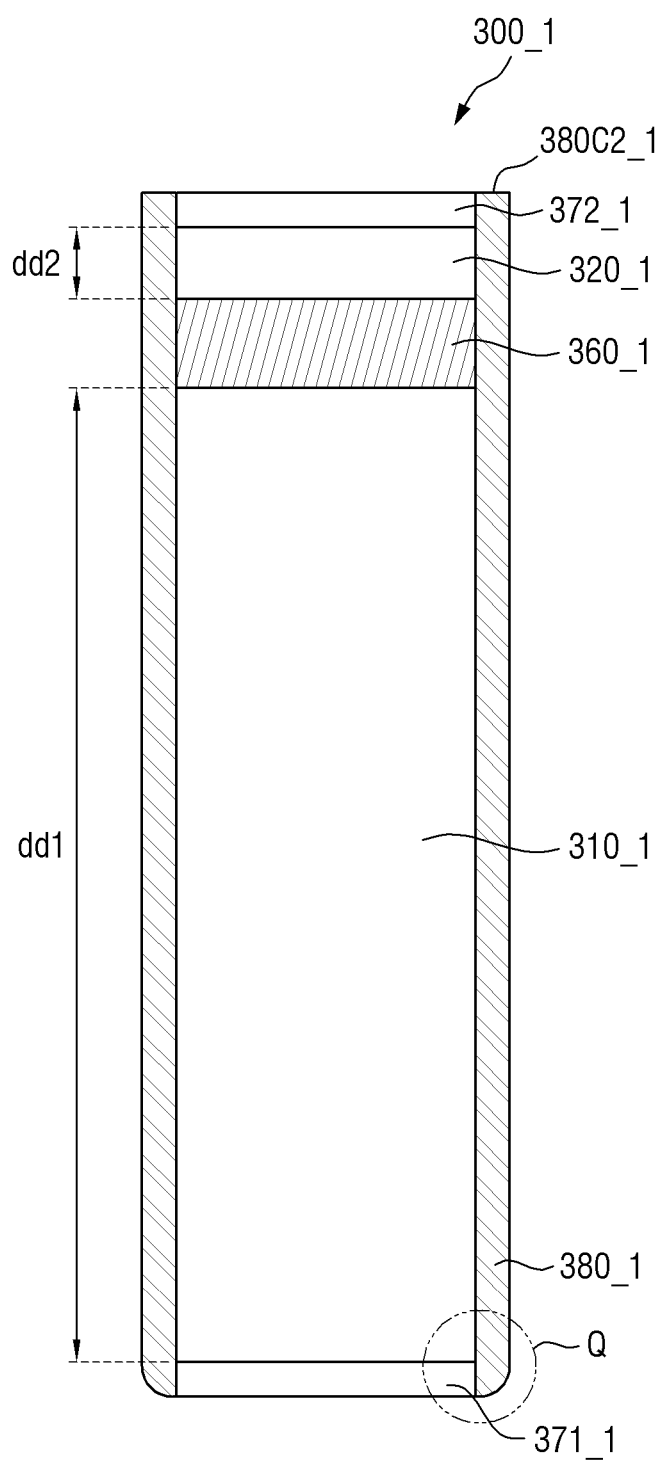
FIG. 15 is a schematic cross-sectional view of a light emitting element according to another embodiment.
Figure 16:
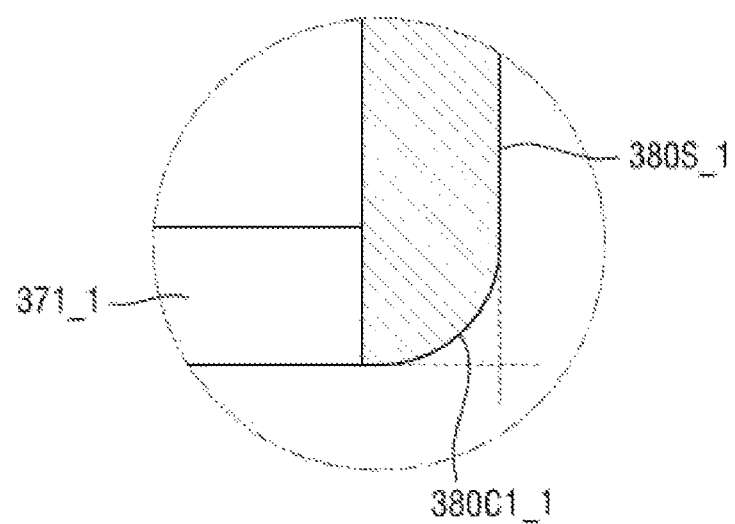
FIG. 16 is an enlarged schematic view of part Q of FIG. 15.

FIG. 15 is a schematic cross-sectional view of a light emitting element according to another embodiment. FIG. 16 is a partially enlarged schematic view of part Q of FIG. 15.

Referring to FIGS. 15 and 16, according to an embodiment, an insulating film 380_1 surrounding an outer surface of a light emitting element 300_1 at, at least, an end thereof may have a shape with a partially curved end surface. The light emitting element 300_1 of FIG. 15 may be different from the light emitting element 300 of FIG. 1 at least in that the end surface of the insulating film 380_1 may have the curved shape. Additional aspects of the layout and the structure of the first electrode layer 371, the first semiconductor layer 310, the active layer 360, and so forth may be the same as those shown in FIG. 1. In the following description, redundant description will be omitted while focusing on differences.

According to an embodiment, the insulating film 380_1 may include a first surface 380S_1 extending in a direction to form an outer surface of the light emitting element 300_1, and a second surface 380C1_1 and a third surface 380C2_1 connecting end surfaces of the light emitting element 300_1, that is, a side surface of a first electrode layer 371_1 and a side surface of a second electrode layer 372_1 to the first surface 380S_1, respectively. The second surface 380C1_1 may have a partially curved shape. For example, a first area of the insulating film 380_1 surrounding a side surface of an active layer 360_1 may have a thickness larger than a thickness of a second area surrounding the side surface of the first electrode layer 371_1.

The light emitting element 300_1 may have a first end surface as a bottom surface of the first electrode layer 371_1 and a second end surface as a top surface of the second electrode layer 372_1. The first end surface may be a surface exposed as the insulating coating film 3800 may be partially removed in the manufacturing process for the light emitting element 300_1, and the second surface may be a surface in contact with the adhesive layer 5100 in the first separation step. The insulating film 380 may include the first surface 380S_1 extending in the direction to form the outer surface of the light emitting element 300_1. The first surface 380S_1 may have a curved or flat outer surface, depending on the shape of the light emitting element 300_1. Here, as illustrated in the drawing, the first surface 380S_1 may be formed as a flat surface in cross-sectional view. The insulating film 380 may include the second surface 380C1_1 connecting the first surface 380S_1 and the first end surface of the light emitting element 300_1, and the third surface 380C2_1 connecting the first surface 380S_1 and the second end surface of the light emitting element 300_1. The second surface 380C1_1 may be a surface positioned adjacent to the first electrode layer 371_1 of the insulating film 380_1, and the third surface 380C2_1 may be a surface positioned adjacent to the second electrode layer 372_1. According to an embodiment, at least a part of the second surface 380C1_1 of the insulating film 380_1 may be curved, and the third surface 380C2_1 thereof may be formed as a flat surface. The third surface 380C2_1 may be on a level with the top surface of the second electrode layer 371_1.

As stated above, since the method of manufacturing the light emitting element 300 may include the step of forming the semiconductor crystal 3000' by etching the semiconductor structure 3000 in the direction from the first electrode layer 371 toward the second electrode layer 372, an area from which the insulating coating film 3800 may be removed to form the insulating film 380 may be the area where the first electrode layer 371 may be disposed. The insulating film 380 of the light emitting element 300 may be formed through the process of partially removing the insulating coating film 3800 to expose the end surface of the first electrode layer 371. As depicted in FIG. 13, the process of removing the insulating coating film 3800 may be carried out by performing etching in a direction perpendicular to the support layer 5200 or the adhesive layer 5100. Accordingly, at least one-side end surface of the insulating film 380 of the light emitting element 300 may be partially removed through the process of partially removing the insulating coating film 3800.

For example, in a manufacturing process of the light emitting element 300_1, the insulating coating film 3800 may be partially removed to expose the first end surface where the first electrode layer 371_1 may be positioned, and the insulating film 380_1 formed resultantly may be given the partially curved second surface 380C1_1 as the material forming the insulating film 380_1 may be partially removed. The insulating coating film 3800 may not be removed at the second end surface where the second electrode layer 372_1 may be positioned, and it may be separated from the adhesive layer 5100. Thus, the insulating film 380_1 may be given the third surface 380C2_1 which may be the flat surface. This structure may be obtained as the etching of the semiconductor structure 3000 in the direction progresses downwards from the top surface of the first electrode material layer 3710, and the process of partially removing the insulating coating film 3800 may be performed to expose the top surface of the first electrode layer 371_1 in the manufacturing process of the light emitting element 300.

Further, according to an embodiment, the distance between the curved second surface 380C1_1 of the insulating film 380_1 and the active layer 360_1 may be larger than the distance between the flat third surface 380C2_1 of the insulating film 380_1 and the active layer 360_1. The second surface 380C1_1 may be positioned adjacent to a bottom surface of a first semiconductor layer 310_1, where the first electrode layer 371_1 may be located. The third surface 380C2_1 may be positioned adjacent to a top surface of a second semiconductor layer 320_1, where the second electrode layer 372_1 may be located. In the light emitting element 300_1, since a distance dd1 between the active layer 360_1 and the first electrode layer 371_1, that is, the length dd1 of the first semiconductor layer 310_1 may be larger than a distance dd2 between the active layer 360_1 and the second electrode layer 372_1, that is, the length dd2 of the second semiconductor layer 320_1, a distance between the active layer 360_1 and the second surface 380C1_1 may be larger than a distance between the active layer 360_1 and the third surface 380C2_1. Accordingly, among the surfaces of the insulating film 380_1 of the light emitting element 300_1, the second surface 380C1_1 having the partially curved outer surface may be located spaced farther from the active layer 360_1 than the flat third surface 380C2_1. However, the disclosure is not limited thereto. In some cases, the second surface 380C1_1 may be located closer to the active layer 360 than the third surface 380C2_1.

Figure 17:
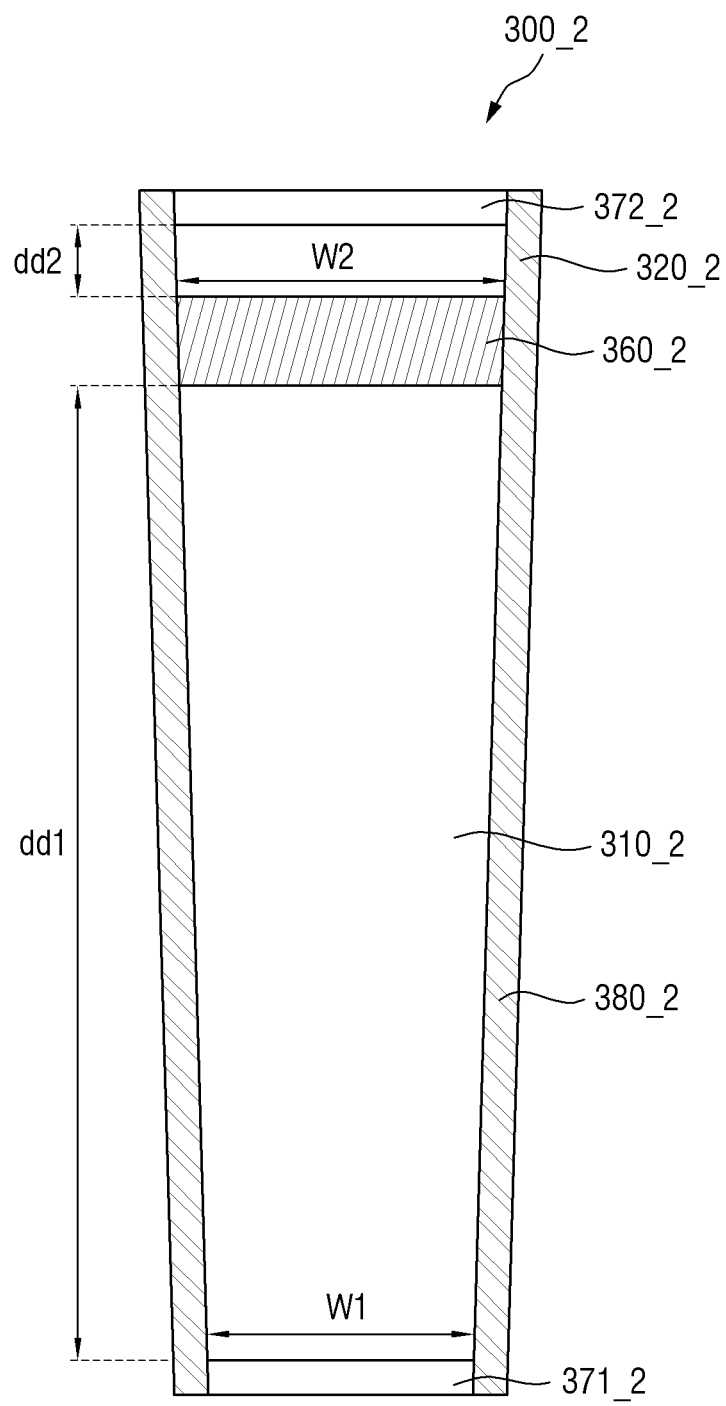
FIG. 17 is a schematic cross-sectional view of a light emitting element according to still another embodiment.

FIG. 17 is a schematic cross-sectional view of a light emitting element according to still another embodiment.

Referring to FIG. 17, the diameter of a light emitting element 300_2 according to an embodiment may increase going from an end toward the other end thereof. For example, in the light emitting element 300_2, a second semiconductor layer 320_2 may have a diameter W2 larger than a diameter W1 of a first semiconductor layer 310_2. The light emitting element 300_1 of FIG. 17 may be different from the light emitting element 300 of FIG. 1 at least in that a diameter W thereof varies depending on positions. Additional aspects of the layout and the structure of a first electrode layer 371_2, the first semiconductor layer 310_2, an active layer 360_2, and so forth may be the same as those described in FIG. 1. In the following description, redundant description will be omitted while focusing on differences.

According to an embodiment, the diameter W of the light emitting element 300_2 may increase going from a first end where the first electrode layer 371_2 may be located toward a second end where a second electrode layer 372_2 may be located. In a manufacturing process of the light emitting element 300_2, the process of etching the semiconductor structure 3000 in a direction may be performed in a downward direction from the top surface of the first electrode material layer 3710. Accordingly, an upper portion of the semiconductor structure 3000 where the first electrode material layer 3710 may be located may be etched more than a lower portion thereof. For example, the semiconductor crystal 3000' formed by etching the semiconductor structure 3000 may be formed with the first electrode layer 371_2 etched more than the second electrode layer 372_2, and the diameter of the semiconductor crystal 3000' may decrease going from the second electrode layer 372_2 to the first electrode layer 371_2.

As illustrated in the drawing, the light emitting element 300_2 increases in diameter going from the first electrode layer 371_2 to the second electrode layer 372_2, and the light emitting element 300_2 may have a shape with an outer surface inclined with respect to a direction in which the light emitting element 300_2 extends (e.g., along insulation film 380_2). In some embodiments, the diameter W1 measured at a bottom surface of the first semiconductor layer 310_2 where the first electrode layer 371_2 may be located may be smaller than the diameter W2 measured at a top surface of the second semiconductor layer 320_2 where the second electrode layer 372_2 may be located.

Unlike the light emitting element 300 of FIG. 1, the light emitting element 300 according to an embodiment may include a larger number of semiconductor layers, and the active layer 360 may include a different element and emit light of a color other than blue.

Figure 18:
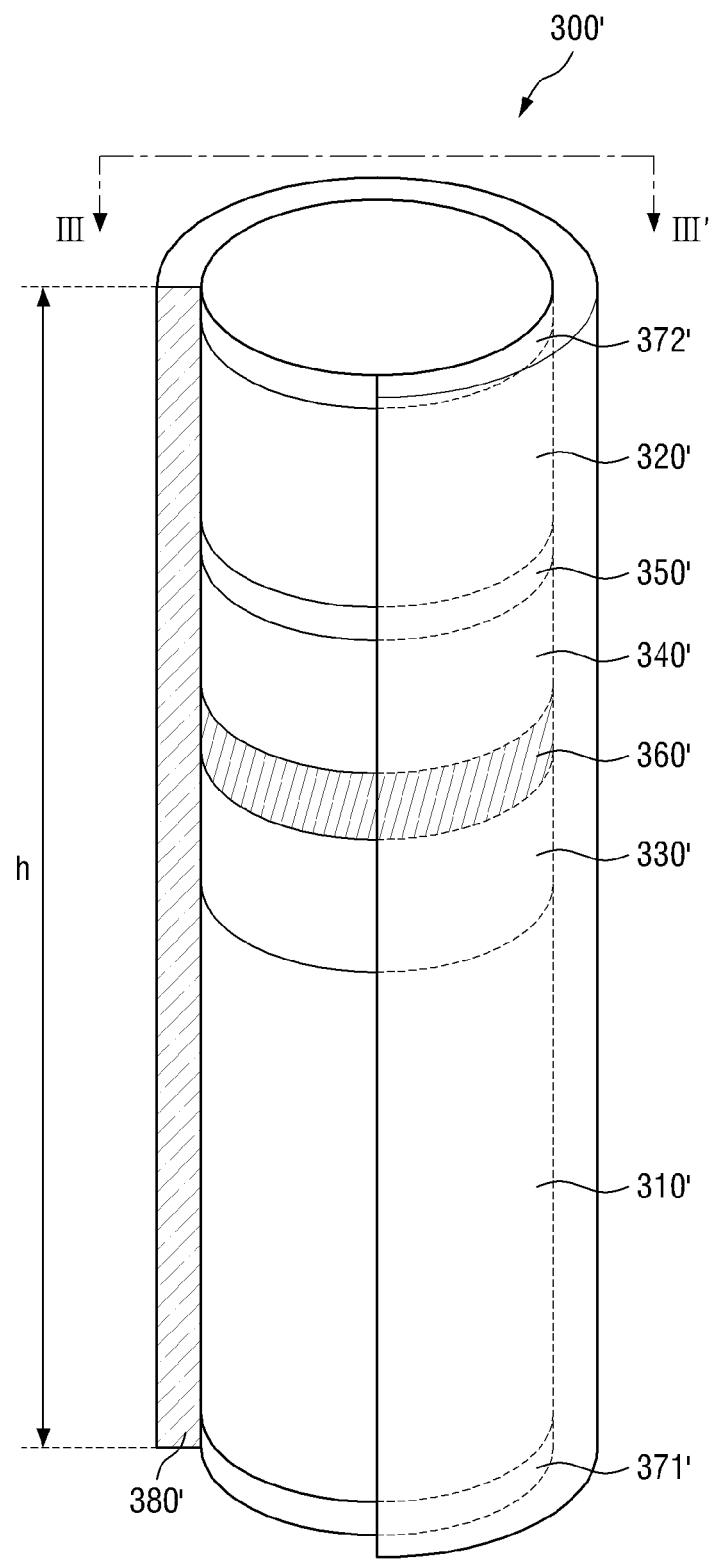
FIG. 18 is a schematic view showing a light emitting element according to another embodiment.
Figure 19:
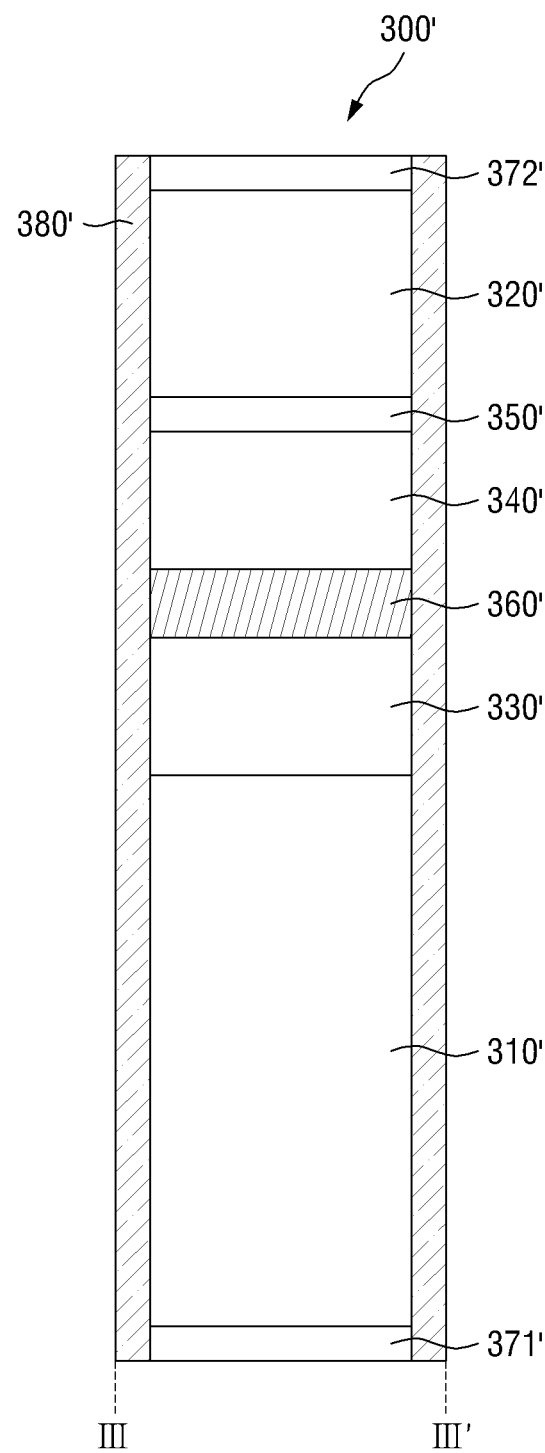
FIG. 19 is a schematic cross-sectional view of a light emitting element taken along line of FIG. 18.

FIG. 18 is a schematic view showing a light emitting element according to another embodiment. FIG. 19 is a schematic cross-sectional view of a light emitting element taken along line III-III' of FIG. 18.

Referring to FIGS. 18 and 19, a light emitting element 300' according to an embodiment may further include a third semiconductor layer 330' disposed between a first semiconductor layer 310' and an active layer 360', and a fourth semiconductor layer 340' and a fifth semiconductor layer 350' disposed between the active layer 360' and a second semiconductor layer 320'. The light emitting element 300' shown in FIGS. 18 and 19 may be different from an embodiment of FIG. 1 and FIG. 2 at least in that the multiple semiconductor layers 330', 340' and 350' may be further provided, and the active layer 360' may include a different element. Additional aspects of the layout and the structure of a first electrode layer 371', a second electrode layer 372' and an insulating film 380' may be substantially the same as those described in FIG. 1. In the following description, redundant description will be omitted while focusing on differences.

As described above, the active layer 360 of the light emitting element 300' shown in FIG. 1 and FIG. 2 may include nitrogen (N), and may emit blue or green light. The active layer 360' and the other semiconductor layers of the light emitting element 300' shown in FIGS. 18 and 19 may be semiconductors including at least phosphorous (P). For example, the light emitting element 300' according to an embodiment may emit red light having a central wavelength band in a range of about 620 nm to about 750 nm. However, it should be understood that the central wavelength band of red light is not limited to the above-mentioned range, and includes all wavelength ranges that can be recognized as red in the art.

To elaborate, if the first semiconductor layer 310' is an n-type semiconductor layer and the light emitting element 300' emits red light, the first semiconductor layer 310' may include a semiconductor material having a chemical formula of $In_xAl_yGa_{1-x-y}P$ ($0 \le x \le 1$, $0 \le y \le 1$, $0 \le x+y \le 1$). For example, the first semiconductor layer 310' may be at least one of InAlGaP, GaP, AlGaP, InGaP, AlP, and InP doped with n-type. The first semiconductor layer 310' may be doped with a first conductive dopant. For example, the first conductive dopant may be Si, Ge, Sn, or the like, or a combination thereof. In an embodiment, the first semiconductor layer 310' may be n-AlGaInP doped with n-type Si. The length of the first semiconductor layer 310' may have a range of about 1.5 μm to about 5 μm, but is not limited thereto.

If the second semiconductor layer 320' is a p-type semiconductor layer and the light emitting element 300' emits red light, the second semiconductor layer 320' may include a semiconductor material having a chemical formula of $In_xAl_yGa_{1-x-y}P$ ($0 \le x \le 1$, $0 \le y \le 1$, $0 \le x+y \le 1$). For example, the second semiconductor layer 320' may be at least one of InAlGaP, GaP, AlGaNP, InGaP, AlP, and InP doped with p-type. The second semiconductor layer 320' may be doped with a second conductive dopant. For example, the second conductive dopant may be Mg, Zn, Ca, Se, Ba, or the like, or a combination thereof. In an embodiment, the second semiconductor layer 320' may be p-GaP doped with p-type Mg. The length of the second semiconductor layer 320' may have a range of about 0.08 μm to about 0.25 μm, but is not limited thereto.

The active layer 360' may be disposed between the first semiconductor layer 310' and the second semiconductor layer 320'. Like the active layer 360 of FIG. 1, the active layer 360' of FIGS. 18 and 19 may also include a material having a single or multiple quantum well structure and emit light of a specific wavelength band. For example, in case that the active layer 360' emits light of a red wavelength band, the active layer 360' may include a material such as AlGaP, AlInGaP, or the like, or a combination thereof. Particularly, in case that the active layer 360' has a structure in which quantum layers and well layers may be alternately stacked on each other in a multiple quantum well structure, the quantum layer may include a material such as AlGaP or AlInGaP, and the well layer may include a material such as GaP or AlInP. In an embodiment, the active layer 360' may include AlGaInP as a quantum layer and AlInP as a well layer to emit red light having a central wavelength band of about 620 nm to about 750 nm.

The light emitting element 300' of FIGS. 18 and 19 may include a cladding layer disposed adjacent to the active layer 360'. As shown in the drawing, the third semiconductor layer 330' and the fourth semiconductor layer 340' respectively disposed below and above the active layer 360' between the first semiconductor layer 310' and the second semiconductor layer 320' may be cladding layers.

The third semiconductor layer 330' may be disposed between the first semiconductor layer 310' and the active layer 360'. The third semiconductor layer 330' may be an n-type semiconductor, the same as the first semiconductor layer 310'. For example, the third semiconductor layer 330' may include a semiconductor material represented by a chemical formula of $In_xAl_yGa_{1-x-y}P$ ($0 \le x \le 1$, $0 \le y \le 1$, $0 \le x+y \le 1$). In an embodiment, the first semiconductor layer 310' may be n-AlGaInP, and the third semiconductor layer 330' may be n-AlInP. However, embodiments are not limited thereto.

The fourth semiconductor layer 340' may be disposed between the active layer 360' and the second semiconductor layer 320'. The fourth semiconductor layer 340' may be an n-type semiconductor, the same as the second semiconductor layer 320'. For example, the fourth semiconductor layer 340' may include a semiconductor material represented by a chemical formula of $In_xAl_yGa_{1-x-y}P$ ($0 \le x \le 1$, $0 \le y \le 1$, $0 \le x+y \le 1$). In an embodiment, the second semiconductor layer 320' may be p-GaP, and the fourth semiconductor layer 340' may be p-AlInP.

The fifth semiconductor layer 350' may be disposed between the fourth semiconductor layer 340' and the second semiconductor layer 320'. The fifth semiconductor layer 350' may be a p-type doped semiconductor, the same as the second semiconductor layer 320' and the fourth semiconductor layer 340'. In some embodiments, the fifth semiconductor layer 350' may function to reduce a difference in lattice constant between the fourth semiconductor layer 340' and the second semiconductor layer 320'. For example, the fifth semiconductor layer 350' may be a tensile strain barrier reducing (TSBR) layer. For example, the fifth semiconductor layer 350' may include p-GaInP, p-AlInP, p-AlGaInP, or the like, or a combination thereof, but is not limited thereto.

The first electrode layer 371' and the second electrode layer 372' may be disposed on the first semiconductor layer 310' and the second semiconductor layer 320', respectively, the same as in the light emitting element 300 of FIG. 1. The first electrode layer 371' may be disposed on the bottom surface of the first semiconductor layer 310', and the second electrode layer 372' may be disposed on the top surface of the second semiconductor layer 320'. The light emitting element 300' of FIGS. 18 and 19 may be manufactured in substantially the same way as the light emitting element 300 of FIG. 1. For example, to manufacture the light emitting element 300' of FIGS. 18 and 19, after the semiconductor structure 3000 including the multiple semiconductor layers and the active layer 360' may be formed, this semiconductor structure 3000 may be separated from the underlying substrate 2000, and the first electrode layer 371' may be formed on an exposed separation surface of the first semiconductor layer 310'. In the light emitting element 300' having a shape extending in a direction, the semiconductor structure 3000 may be etched in a direction from the first electrode layer 371' toward the second semiconductor layer 372'. Detailed description thereof will be omitted, as it may be the same as described above.

According to an embodiment, the display device 10 may include the above-described light emitting element 300 to display light of a specific wavelength band. In some embodiments, the display device 10 may include the light emitting element 300 of FIG. 1 to display blue or green light, or may include the light emitting element 300' of FIG. 18 to display red light.

Figure 20:
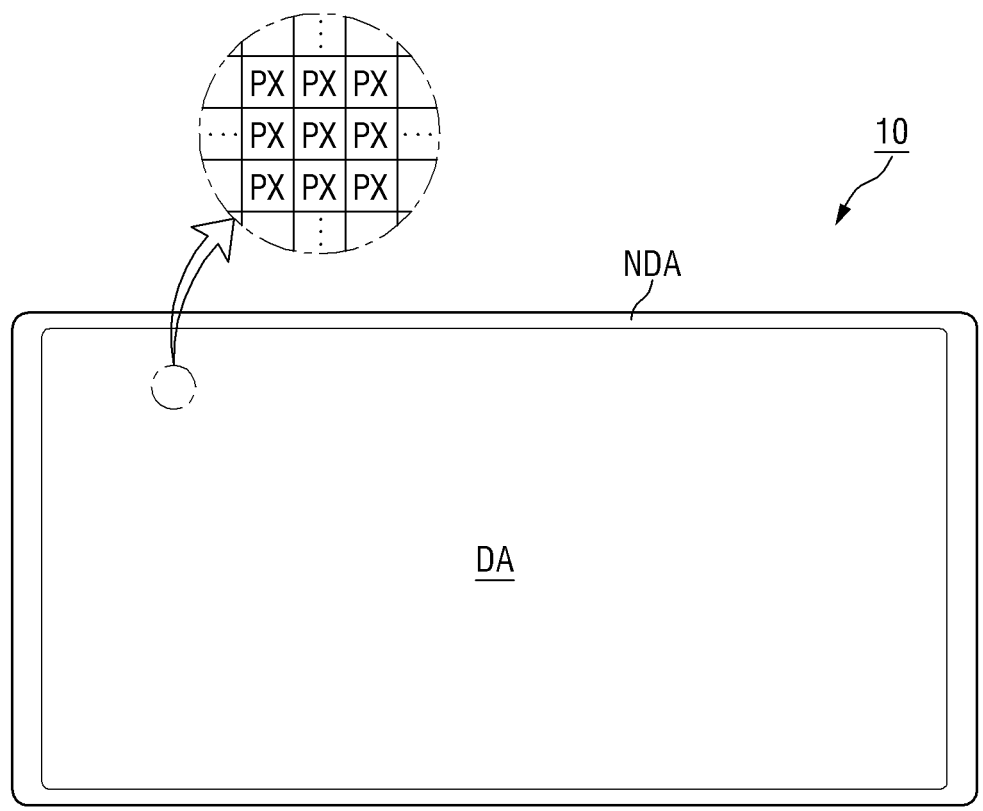
FIG. 20 is a schematic plan view of a display device according to an embodiment.

FIG. 20 is a schematic plan view of a display device according to an embodiment.

Referring to FIG. 20, the display device 10 may display a moving image or a still image. The display device 10 may refer to any electronic device providing a display screen. Examples of the display device 10 may include a television, a laptop computer, a monitor, a billboard, an Internet-of-Things device, a mobile phone, a smartphone, a tablet personal computer (PC), an electronic watch, a smart watch, a watch phone, a head-mounted display, a mobile communication terminal, an electronic notebook, an electronic book, a portable multimedia player (PMP), a navigation device, a game machine, a digital camera, a camcorder and the like, which provide a display screen.

The display device 10 may include a display panel which provides a display screen. Examples of the display panel may include an LED display panel, an organic light emitting display panel, a quantum dot light emitting display panel, a plasma display panel, and a field emission display panel. In the following description, a case where an LED display panel may be applied as a display panel will be discussed as an example, but the disclosure is not limited thereto, and other display panels may be applied and are within the scope of this disclosure.

The shape of the display device 10 may be variously modified. For example, the display device 10 may have a shape such as a rectangular shape elongated in a horizontal direction, a rectangular shape elongated in a vertical direction, a square shape, a quadrilateral shape with rounded corners (vertices), another polygonal shape, and a circular shape. The shape of a display area DA of the display device 10 may also be similar to the overall shape of the display device 10. In FIG. 20, the display device 10 and the display area DA having a rectangular shape elongated in the horizontal direction are illustrated.

The display device 10 may include the display area DA and a non-display area NDA. The display area DA may be an area where a screen can be displayed, and the non-display area NDA may be an area where a screen may not be displayed. The display area DA may also be referred to as an active region, and the non-display area NDA may also be referred to as a non-active region.

The display area DA may substantially occupy the center of the display device 10. The display area DA may include pixels PX. The pixels PX may be arranged in a matrix. The shape of each pixel PX may be a rectangular or square shape in plan view. However, the disclosure is not limited thereto, and it may be a rhombic shape in which each side may be inclined with respect to a first direction DR1. Each of the pixels PX may include one or more light emitting elements 300 that emit light of a specific wavelength band to display a specific color.

Figure 21:
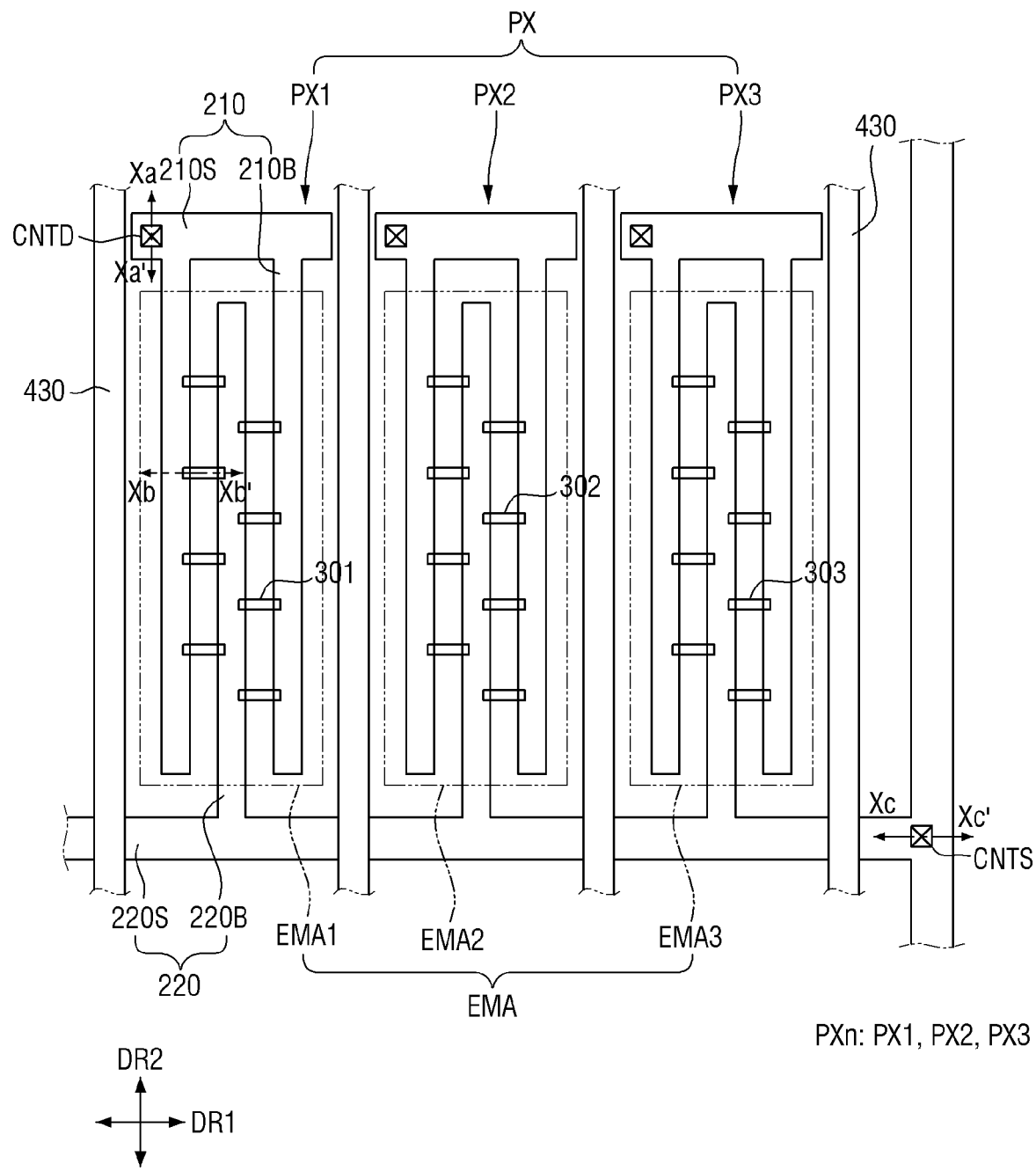
FIG. 21 is a schematic plan view of a pixel of a display device according to an embodiment.

FIG. 21 is a schematic plan view of a pixel of a display device according to an embodiment.

Referring to FIG. 21, each of the pixels PX may include a first sub-pixel PX1, a second sub-pixel PX2, and a third sub-pixel PX3. The first sub-pixel PX1 may emit light of a first color, the second sub-pixel PX2 may emit light of a second color, and the third sub-pixel PX3 may emit light of a third color. The first color may be blue, the second color may be green, and the third color may be red, but they are not limited thereto. All the sub-pixels PXn may emit light of the same color. Although FIG. 21 illustrates that the pixel PX includes three sub-pixels PXn, the disclosure is not limited thereto, and the pixel PX may include a larger number of sub-pixels PXn.

In the disclosure, although "first," "second," and so forth are used to refer to individual components, they are used to simply distinguish the components and do not necessarily mean the components. For example, the components defined as "first," "second," and so forth are not necessarily limited to particular structures or locations, and, in some cases, other reference numerals may be assigned. Therefore, the reference numerals assigned to the individual components may be explained through the drawings and the description below, and a first component mentioned below may be a second component and would remain within the scope of this disclosure.

Each sub-pixel PXn of the display device 10 may include a region defined as an emission area EMA. The first sub-pixel PX1 may include a first emission area EMA1, the second sub-pixel PX2 may include a second emission area EMA2, and the third sub-pixel PX3 may include a third emission area EMA3. The emission area EMA may be defined as a region where the light emitting elements 300 included in the display device 10 may be disposed to emit light of a specific wavelength band. The light emitting element 300 may include the active layer 360, and the active layer 360 may emit light of a specific wavelength band without directionality. For example, lights emitted from the active layer 360 of the light emitting element 300 may be radiated in a lateral direction of the light emitting element 300 as well as in directions of ends of the light emitting element 300. The emission area EMA of each sub-pixel PXn may include a region adjacent to the light emitting element 300 where the lights emitted from the light emitting element 300 may be radiated, including the region where the light emitting element 300 may be disposed. Further, without being limited thereto, the emission area EMA may also include a region where the light emitted from the light emitting element 300 may be reflected or refracted by another member and emitted. The light emitting elements 300 may be disposed in the respective sub-pixels PXn, and the emission area EMA may be formed to include an area where the light emitting element 300 may be disposed and an area adjacent thereto.

Although not illustrated in the drawing, each sub-pixel PXn of the display device 10 may include a non-emission area defined as a region other than the emission area EMA. The non-emission area may be defined as a region in which the light emitting element 300 may not be disposed and a region from which light may not be emitted because light emitted from the light emitting element 300 may not reach it.

Figure 22:
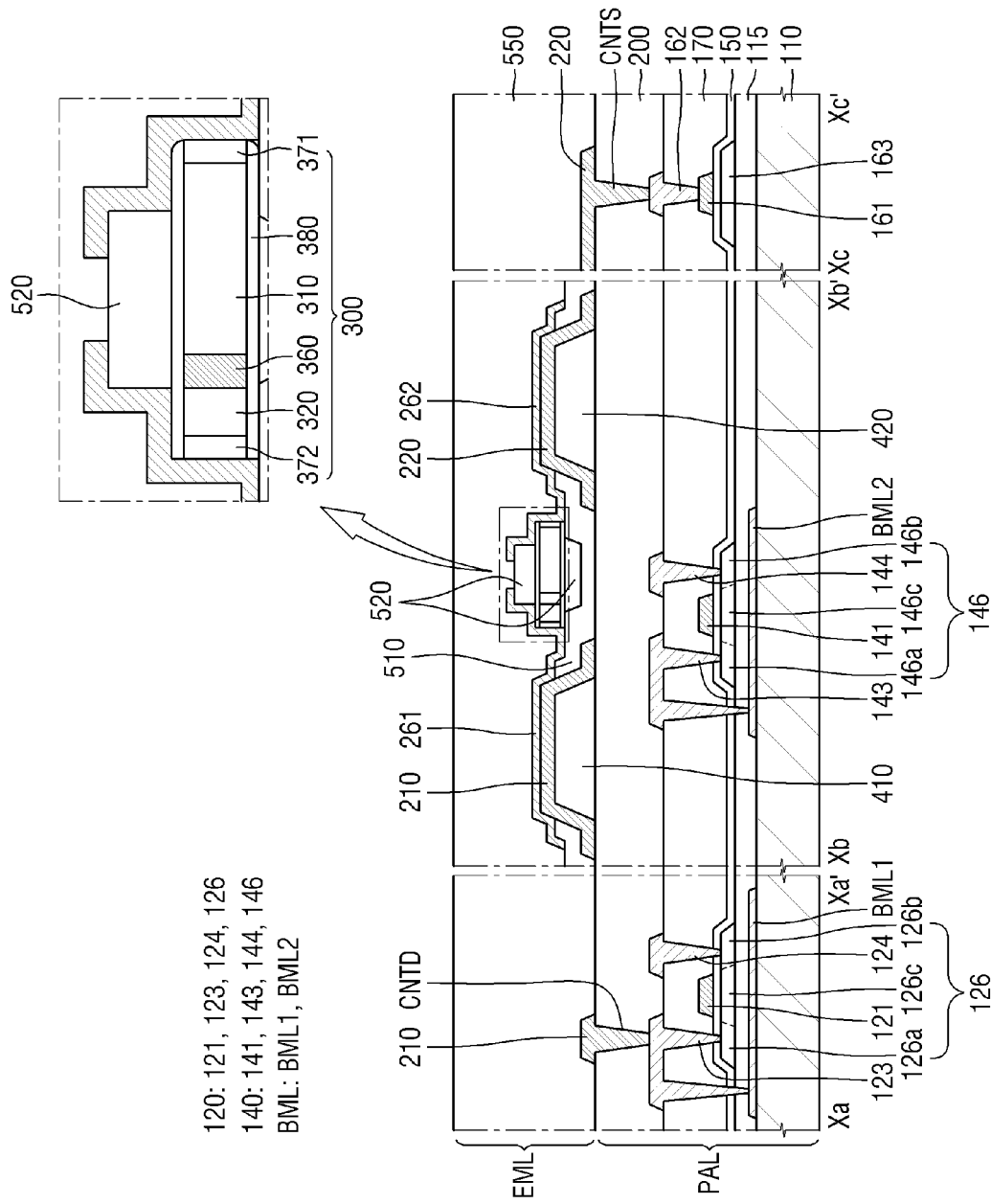
FIG. 22 is a schematic cross-sectional view taken along lines Xa-Xa', Xb-Xb' and Xc-Xc' of FIG. 21.

Each sub-pixel PXn of the display device 10 may include electrodes 210 and 220, the light emitting elements 300, banks 410, 420, and 430 (see FIG. 22), and at least one insulating layer 510, 520 or 550 (see FIG. 22).

The electrodes 210 and 220 may be electrically connected with the light emitting elements 300, and may receive a preset voltage applied thereto to allow the light emitting elements 300 to emit light in a specific wavelength band. Further, at least a part of each of the electrodes 210 and 220 may be used to form an electric field within the sub-pixel PXn to align the light emitting elements 300.

The electrodes 210 and 220 may include a first electrode 210 and a second electrode 220. In an embodiment, the first electrode 210 may be a pixel electrode which may be separated for each sub-pixel PXn, and the second electrode 220 may be a common electrode connected along the respective sub-pixels PXn to be shared by them. One of the first and second electrodes 210 and 220 may be an anode electrode of the light emitting element 300 and another may be a cathode electrode of the light emitting element 300. However, the disclosure is not limited thereto, and an opposite case may also be possible.

The first and second electrodes 210 and 220 may include respective electrode stems 210S and 220S arranged to extend in the first direction DR1 and at least one respective electrode branches 210B and 220B extending, in the second direction DR2 crossing the first direction DR1, from the respective electrode stems 210S and 220S.

The first electrode 210 may include the first electrode stem 210S extending in the first direction DR1; and at least one electrode branch 210B branched off from the first electrode stem 210S and extending in the second direction DR2.

The first electrode stems 210S of a pixel may be arranged such that both ends of the individual first electrode stems 210S may be terminated with gaps between the respective sub-pixels PXn, and each first electrode stem 210S may be arranged on substantially the same straight line as the first electrode stem 210S of the sub-pixel adjacent to it in the same row (for example, in the first direction DR1). Since the first electrode stems 210S disposed in the respective sub-pixels PXn may be arranged such that both ends thereof may be spaced apart from each other, it may be possible to apply different electric signals to the first electrode branches 210B, so that the first electrode branches 210B may be driven individually.

The first electrode branch 210B may be branched off from at least a part of the first electrode stem 210S and extend in the second direction DR2, and may be terminated while being spaced apart from the second electrode stem 220S which may be disposed to face the first electrode stem 210S.

The second electrode 220 may include the second electrode stem 220S extending in the first direction DR1 and disposed to face the first electrode stem 210S while being distanced apart from it in the second direction DR2; and the second electrode branch 220B branched off from the second electrode stem 220S and extending in the second direction DR2. The second electrode stem 220S may be connected at the other end to the second electrode stem 220S of another sub-pixel PXn adjacent to it in the first direction DR1. For example, unlike the first electrode stem 210S, the second electrode stem 220S may extend in the first direction DR1 across the respective sub-pixels PXn. The second electrode stem 220S that may be elongated across the respective sub-pixels PXn may be connected to an outer part of the display area DA where the respective pixels PX or sub-pixels PXn may be placed, or to an extension portion extended from the non-display area NDA in a direction.

The second electrode branch 220B may be disposed to face the first electrode branch 210B with a gap therebetween, and may be terminated while being spaced apart from the first electrode stem 210S. The second electrode branch 220B may be connected with the second electrode stem 220S, and an end of the second electrode branch 220B in the extension direction may be disposed within the sub-pixel PXn while being spaced apart from the first electrode stem 210S.

In the drawing, it is illustrated that two first electrode branches 210B may be disposed in each sub-pixel PXn, and a second electrode branch 220B may be disposed therebetween. However, the layout of the first and second electrode branches may not be limited thereto. Further, the first and second electrodes 210 and 220 may not necessarily have the shape extending in a direction, and they may have various layouts. For example, the first electrode 210 and the second electrode 220 may have a partially curved or bent shape, and an electrode may be disposed to surround another electrode. The layout and the shape of the first and second electrodes 210 and 220 may not be particularly limited as long as at least some portions thereof face each other with a gap therebetween, creating a space where the light emitting elements 300 may be disposed.

Further, the first electrode 210 and the second electrode 220 may be electrically connected with a circuit element layer PAL (see FIG. 22) of the display device 10 through contact holes, for example, a first electrode contact hole CNTD and a second electrode contact hole CNTS, respectively. It is illustrated in the drawing that the second electrode contact hole CNTD may be formed at every first electrode stem 210S of each sub-pixel PXn, whereas only one second electrode contact hole CNTS may be formed at the single second electrode stem 220S which may be elongated across the respective sub-pixels PXn. However, the disclosure is not limited thereto, and the second electrode contact hole CNTS may also be formed for every sub-pixel PXn, if necessary.

The multiple banks 410, 420 and 430 may include the external banks 430 disposed at the boundaries between the sub-pixels PXn, and the internal banks 410 and 420 disposed under the electrodes 210 and 220 to be adjacent to the center of each sub-pixel PXn. Although the internal banks 410 and 420 are not illustrated in the drawing, the first internal bank 410 and the second internal bank 420 may be disposed under the first electrode branch 210B and the second electrode branch 220B, respectively. A description thereof will be given later with reference to other drawings.

The external banks 430 may be disposed at the boundaries between the sub-pixels PXn. The first electrode stems 210S may be terminated such that their respective ends may be spaced apart from each other with the external banks 430 therebetween. Each external bank 430 may extend in the second direction DR2 to be disposed at the boundary between the adjacent sub-pixels PXn which may be arranged in the first direction DR1. However, the disclosure is not limited thereto, and the external bank 430 may extend in the first direction DR1 to be disposed at the boundary between the adjacent sub-pixels PXn which may be arranged in the second direction DR2. The external banks 430 may include the same material as the internal banks 410 and 420, and these external and internal banks may be formed simultaneously in one process.

The light emitting elements 300 may be disposed between the first electrode 210 and the second electrode 220. As shown in the drawing, the light emitting elements 300 may be disposed between the first electrode branch 210B and the second electrode branch 220B. At least some of the light emitting elements 300 may be electrically connected at an end thereof to the first electrode 210 and electrically connected at another end thereof to the second electrode 220. Each light emitting element 300 may be disposed such that ends thereof may be located on the first electrode branch 210B and the second electrode branch 220B, respectively, but not limited thereto. In some cases, the light emitting element 300 may be disposed between the first electrode 210 and the second electrode 220 lest both ends thereof should overlap the first and second electrodes 210 and 220.

The light emitting elements 300 may be arranged substantially in parallel with each other between the electrodes 210 and 220, while being distanced apart from each other. The interval between the light emitting elements 300 is not particularly limited. In some cases, multiple light emitting elements 300 may be disposed adjacent to each other to form a group, and other multiple light emitting elements 300 may be arranged while being spaced apart from each other at a regular distance to form another group. For example, the light emitting elements 300 may be arranged in different densities but they may be still aligned in a direction. Further, in an embodiment, the light emitting element 300 may have a shape extending in a direction, and the extension direction of the electrodes, for example, the first electrode branch 210B and the second electrode branch 220B, may be substantially perpendicular to the extension direction of the light emitting element 300. However, the disclosure is not limited thereto, and the light emitting element 300 may be disposed diagonally with respect to the extension direction of the first electrode branch 210B and the second electrode branch 220B, not perpendicularly thereto.

The light emitting elements 300 according to an embodiment may have the active layers 360 including different materials, and thus may emit lights of different wavelength bands to the outside. The display device 10 according to an embodiment may include the light emitting elements 300 that emit light of different wavelength bands. The display device 10 may include a first light emitting element 301 disposed in the first sub-pixel PX1, a second light emitting element 302 disposed in the second sub-pixel PX2, and a third light emitting element 303 disposed in the third sub-pixel PX3.

The first and second light emitting elements 301 and 302 may have the same structure as the light emitting element 300 of FIG. 1. The first light emitting element 301 may include the active layer 360 that emits first light having a first wavelength as a central wavelength band, and the second light emitting element 302 may include the active layer 360 that emits second light having a second wavelength as a central wavelength band. Accordingly, the first light may be radiated from the first sub-pixel PX1, and the second light may be radiated from the second sub-pixel PX2. The third light emitting element 303 may include the active layer 360' that emits third light having a third wavelength as a central wavelength band, the same as the light emitting element 300' of FIG. 17. Unlike the first and second light emitting elements 301 and 302, the third light emitting element 303 may further include the third semiconductor layer 330', the fourth semiconductor layer 340', and the fifth semiconductor layer 350'. The third light may be radiated from the third sub-pixel PX3. In some embodiments, the display device 10 may include light emitting elements including the active layers 360 that emit lights of different colors, for example, the first light emitting element 301, the second light emitting element 302, and the third light emitting element 303. Each of the first light emitting element 301, the second light emitting element 302, and the third light emitting element 303 may include the active layers 360 and 360' that emit the first light, the second light and the third light, respectively.

In some embodiments, the first light may be blue light having a central wavelength band of about 450 nm to about 495 nm, the second light may be green light having a central wavelength band of about 495 nm to about 570 nm, and the third light may be red light having a central wavelength band of about 620 nm to about 752 nm. However, the disclosure is not limited thereto. The first light, the second light, and the third light may be of different colors, or may be of same color but their central wavelength bands may differ from the above-specified ranges.

Furthermore, although not illustrated in the drawing, the display device 10 may include the first insulating layer 510 that covers at least a part of the first electrode 210 and a part of the second electrode 220.

The first insulating layer 510 may be disposed in each sub-pixel PXn of the display device 10. The first insulating layer 510 may be disposed to substantially entirely cover each sub-pixel PXn, and may be extended to other neighboring sub-pixels PXn. The first insulating layer 510 may be disposed to cover at least a part of the first electrode 210 and a part of the second electrode 220. Although not illustrated in FIG. 22, the first insulating layer 510 may be disposed to allow some areas of the first and second electrodes 210 and 220, specifically, some areas of the first and second branches 210B and 220B to be exposed.

The display device 10 may include, in addition to the first insulating layer 510, the circuit element layer PAL disposed under the electrodes 210 and 220, a second insulating layer 520 (see FIG. 22) disposed to cover at least some parts of the electrodes 210 and 220 and the light emitting element 300, and a passivation layer 550 (see FIG. 22). Below, the structure of the display device 10 will be elaborated with reference to FIG. 22.

FIG. 22 is a schematic cross-sectional view taken along lines Xa-Xa', Xb-Xb' and Xc-Xc' of FIG. 21.

FIG. 22 only shows a cross section of the second sub-pixel PX2, but the same may be applied to other pixels PX or sub-pixels PXn. FIG. 22 shows a cross section across ends and other ends of a certain light emitting element 300.

Referring to FIG. 21 and FIG. 22, the display device 10 may include the circuit element layer PAL and an emission layer EML. The circuit element layer PAL may include a substrate 110, a buffer layer 115, a light blocking layer BML, first and second transistors 120 and 140, and so forth. The emission layer EML may include the electrodes 210 and 220, the light emitting element 300, the insulating layers 510, 520, and 550, and so forth which may be disposed on the first and second transistors 120 and 140.

The substrate 110 may be an insulating substrate. The substrate 110 may be made of an insulating material such as glass, quartz, polymer resin, or a combination thereof. Further, the substrate 110 may be a rigid substrate, but may also be a flexible substrate which can be bent, folded or rolled.

The light blocking layer BML may be disposed on the substrate 110. The light blocking layer BML may include a first light blocking layer BML1 and a second light blocking layer BML2. The first light blocking layer BML1 may be electrically connected with a first drain electrode 123 of the first transistor 120 to be described later. The second light blocking layer BML2 may be electrically connected with a second drain electrode 143 of the second transistor 140.

The first light blocking layer BML1 and the second light blocking layer BML2 may be arranged to overlap a first active material layer 126 of the first transistor 120 and a second active material layer 146 of the second transistor 140, respectively. The first and second light blocking layers BML1 and BML2 may include a material that blocks light, and thus can prevent light from reaching the first and second active material layers 126 and 146. For example, the first and second light blocking layers BML1 and BML2 may be formed of an opaque metal material that blocks light transmission. However, the disclosure is not limited thereto, and in some cases, the light blocking layer BML may be omitted.

The buffer layer 115 may be disposed on the light blocking layer BML and the substrate 110. The buffer layer 115 may be disposed to cover the entire surface of the substrate 110, including the light blocking layer BML. The buffer layer 115 can prevent diffusion of impurity ions, prevent penetration of moisture or external air, and perform a surface planarization function. Furthermore, the buffer layer 115 may serve to insulate the light blocking layer BML and the first and second active material layers 126 and 146 from each other.

A semiconductor layer may be disposed on the buffer layer 115. The semiconductor layer may include the first active material layer 126 of the first transistor 120, the second active material layer 146 of the second transistor 140, and an auxiliary layer 163. The semiconductor layer may include polycrystalline silicon, monocrystalline silicon, oxide semiconductor, and the like.

The first active material layer 126 may include a first doping area 126a, a second doping area 126b, and a first channel area 126c. The first channel area 126c may be disposed between the first doping area 126a and the second doping area 126b. The second active material layer 146 may include a third doping area 146a, a fourth doping area 146b, and a second channel area 146c. The second channel area 146c may be disposed between the third doping area 146a and the fourth doping area 146b. The first active material layer 126 and the second active material layer 146 may include polycrystalline silicon. The polycrystalline silicon may be formed by crystallizing amorphous silicon. Examples of the crystallizing method may include rapid thermal annealing (RTA), solid phase crystallization (SPC), excimer laser annealing (ELA), metal-induced lateral crystallization (MILC), and sequential lateral solidification (SLS), but are not limited thereto. As another example, the first active material layer 126 and the second active material layer 146 may include monocrystal silicon, low-temperature polycrystalline silicon, amorphous silicon, or the like, or a combination thereof. The first doping area 126a, the second doping area 126b, the third doping area 146a, and the fourth doping area 146b may be some areas of the first active material layer 126 and the second active material layer 146 doped with impurities. However, the disclosure is not limited thereto.

A first gate insulating film 150 may be disposed on the semiconductor layer. The first gate insulating film 150 may be disposed to cover the entire surface of the buffer layer 115, including the semiconductor layer. The first gate insulating film 150 may function as a gate insulating film for the first and second transistors 120 and 140.

A first conductive layer may be disposed on the first gate insulating film 150. The first conductive layer may include a first gate electrode 121 disposed on the first active material layer 126 of the first transistor 120, a second gate electrode 141 disposed on the second active material layer 146 of the second transistor 140, and a power wire 161 disposed on the auxiliary layer 163 on the first gate insulating film 150. The first gate electrode 121 may overlap the first channel area 126c of the first active material layer 126, and the second gate electrode 141 may overlap the second channel area 146c of the second active material layer 146.

An interlayer insulating film 170 may be disposed on the first conductive layer. The interlayer insulating film 170 may serve as an insulating film between the layers. The interlayer insulating film 170 may contain an organic insulating material and may also perform a surface planarization function.

A second conductive layer may be disposed on the interlayer insulating film 170. The second conductive layer may include the first drain electrode 123 and a first source electrode 124 of the first transistor 120, the second drain electrode 143 and a second source electrode 144 of the second transistor 140, and a power electrode 162 disposed on the power wire 161.

The first drain electrode 123 and the first source electrode 124 may be in contact with the first doping area 126a and the second doping area 126b of the first active material layer 126, respectively, via contact holes formed through the interlayer insulation film 170 and the first gate insulating film 150. The second drain electrode 143 and the second source electrode 144 may be in contact with the third doping area 146a and the fourth doping area 146b of the second active material layer 146, respectively, via contact holes formed through the interlayer insulation film 170 and the first gate insulating film 150. Further, the first drain electrode 123 and the second drain electrode 143 may be electrically connected with the first light blocking layer BML1 and the second light blocking layer BML2, respectively, via other contact holes.

A via layer 200 may be disposed on the second conductive layer. The via layer 200 may include an organic insulating material, and may perform a surface planarization function.

The multiple banks 410, 420, and 430, the electrodes 210 and 220, and the light emitting element 300 may be disposed on the via layer 200.

The multiple banks 410, 420, and 430 may include the internal banks 410 and 420 arranged within each sub-pixel PXn while being spaced apart from each other, and the external banks 430 disposed at the boundaries between the neighboring sub-pixels PXn.

The external banks 430 may function to prevent ink from going over the boundaries of the sub-pixels PXn in case jetting the ink in which the light emitting elements 300 may be dispersed using an inkjet printing device in the manufacture of the display device 10. However, embodiments are not limited thereto.

The multiple internal banks 410 and 420 may include the first internal bank 410 and the second internal bank 420 disposed adjacent to the center of each sub-pixel PXn.

The first internal bank 410 and the second internal bank 420 may be disposed to face each other while being spaced apart from each other. The first electrode 210 may be disposed on the first internal bank 410, and the second electrode 220 may be disposed on the second internal bank 420. Referring to FIGS. 21 and 22, it can be understood that the first electrode branch 210B may be disposed on the first internal bank 410, and the second electrode branch 220B may be disposed on the second internal bank 420.

The first internal bank 410 and the second internal bank 420 may extend in the second direction DR2 within each sub-pixel PXn. Though not illustrated in the drawing, the first internal bank 410 and the second internal back 420 may extend in the second direction DR2 toward the sub-pixels PXn adjacent in the second direction DR2. However, the disclosure is not limited thereto, and the first internal bank 410 and the second internal bank 420 may be disposed in each of the sub-pixels PXn separately, forming a pattern on the entire surface of the display device 10. The multiple banks 410, 420 and 430 may include polyimide (PI), but are not limited thereto.

Each of the first internal bank 410 and the second internal bank 420 may have a structure with at least a part thereof protruding above the via layer 200. Each of the first internal bank 410 and the second internal bank 420 may protrude above the plane on which the light emitting element 300 may be disposed, and at least a part of this protruding portion may have a slope. The shape of the protruding portions of the first and second internal banks 410 and 420 is not particularly limited.

The electrodes 210 and 220 may be disposed on the via layer 200 and the internal banks 410 and 420, respectively. As stated above, the electrodes 210 and 220 may include the electrode stems 210S and 220S and the electrode branches 210B and 220B, respectively. The line Xa-Xa' of FIG. 21 may be a line that crosses the first electrode stem 210S, the line Xb-Xb' of FIG. 21 may be a line that crosses the first and second electrode branches 210B and 220B, and the line Xc-Xc' of FIG. 21 may be a line that crosses the second electrode stem 220S. For example, the first electrode 210 disposed in the area Xa-Xa' of FIG. 22 can be understood to be the first electrode stem 210S; the first electrode 210 and the second electrode 220 disposed in the area Xb-Xb' of FIG. 22 can be understood to be the first electrode branch 210B and the second electrode branch 220B, respectively; and the second electrode 220 disposed in the area Xc-Xc' of FIG. 22 can be understood to be the second electrode stem 220S. The electrode stems 210S and the electrode branch 210B may constitute the first electrode 210, and the electrode 220S and the electrode branch 220B may constitute the second electrode 220.

Some areas of the first and second electrodes 210 and 220 may be disposed on the via layer 200, and some other areas thereof may be disposed on the first and second internal banks 410 and 420, respectively. As stated above, the first electrode stem 210S of the first electrode 210 and the second electrode stem 220S of the second electrode 220 may extend in the first direction DR1, and the first internal bank 410 and the second internal bank 420 may extend in the second direction DR2 to be disposed in the neighboring sub-pixels PXn in the second direction DR2. Although not illustrated in the drawings, the first electrode stem 210S of the first electrode 210 and the second electrode stem 220S of the second electrode 220 which extend in the first direction DR1 may partially overlap the first internal bank 410 and the second internal bank 420, respectively. However, the disclosure is not limited thereto, and the first electrode stem 210S and the second electrode stem 220S may not overlap the first internal bank 410 and the second internal bank 420, respectively.

The first electrode stem 210S of the first electrode 210 may be provided with the first electrode contact hole CNDT formed through the via layer 200 to expose a part of the first drain electrode 123 of the first transistor 120. The first electrode 210 may be in contact with the first drain electrode 123 through the first electrode contact hole CNTD. The first electrode 210 may be electrically connected with the first drain electrode 123 of the first transistor 120 to receive a preset electrical signal therefrom.

The second electrode stem 220S of the second electrode 220 may extend in a direction to be disposed in a non-emission area as well, where no light emitting element 300 may be disposed. The second electrode stem 220S may be provided with the second electrode contact hole CNTS formed through the via layer 200 to expose a part of the power electrode 162. The second electrode 220 may be in contact with the power electrode 162 through the second electrode contact hole CNTS. The second electrode 220 may be electrically connected with the power electrode 162 to receive a preset electrical signal from the power electrode 162.

Some areas of the first electrode 210 and the second electrode 220, for example, the first electrode branch 210B and the second electrode branch 220B may be disposed on the first internal bank 410 and the second internal bank 420, respectively. The first electrode branch 210B of the first electrode 210 may be disposed to cover the first internal bank 410, and the second electrode branch 220B of the second electrode 220 may be disposed to cover the second internal bank 420. Since the first internal bank 410 and the second internal bank 420 may be disposed at the center of each sub-pixel PXn while being spaced apart from each other, the first electrode branch 210B and the second electrode branch 220B may also be disposed apart from each other. The multiple light emitting elements 300 may be disposed in a region between the first electrode 210 and the second electrode 220, that is, in the space where the first electrode branch 210B and the second electrode branch 220B may be disposed to face each other with a gap therebetween.

Each of the electrodes 210 and 220 may include a transparent conductive material. For example, each of the electrodes 210 and 220 may include a material such as indium tin oxide (ITO), indium zinc oxide (IZO), indium tin zinc oxide (ITZO), or a combination thereof, but embodiments are not limited thereto. In some embodiments, each of the electrodes 210 and 220 may include a conductive material having high reflectivity. For example, each of the electrodes 210 and 220 may include, as a material having high reflectivity, metal such as silver (Ag), copper (Cu), aluminum (Al), or a combination thereof. In this case, light incident to each of the electrodes 210 and 220 may be reflected to be radiated in an upward direction of each sub-pixel PXn.

Further, each of the electrodes 210 and 220 may have a structure in which at least one transparent conductive material and at least one metal layer having high reflectivity may be stacked on each other, or may be formed as a layer including them. In an embodiment, each of the electrodes 210 and 220 may have a stacked structure of ITO/silver (Ag)/ITO/IZO, or may be made of an alloy including aluminum (Al), nickel (Ni), and lanthanum (La). However, embodiments are not limited thereto.

The first insulating layer 510 may be disposed on the via layer 200, the first electrode 210 and the second electrode 220. The first insulating layer 510 may be disposed to partially cover the first electrode 210 and the second electrode 220. The first insulating layer 510 may be disposed to cover most of the top surfaces of the first and second electrodes 210 and 220 while allowing a part of the first and second electrodes 210 and 220 to be exposed. The first insulating layer 510 may be disposed such that some of the top surfaces of the first and second electrodes 210 and 220, for example, a part of the top surface of the first electrode branch 210B disposed on the first internal bank 410 and a part of the top surface of the second electrode branch 220B disposed on the second internal bank 420 may be exposed. For example, the first insulating layer 510 may be formed on the substantially entire surface of the via layer 200 but it may have openings through which the first electrode 210 and the second electrode 220 may be partially exposed. The openings of the first insulating layer 510 may be positioned to allow the relatively flat top surfaces of the first electrode 210 and the second electrode 220 to be exposed therethrough.

In an embodiment, the first insulating layer 510 may be formed to have a step such that a portion of the top surface thereof may be recessed between the first electrode 210 and the second electrode 220. In some embodiments, the first insulating layer 510 may include an inorganic insulating material, and a portion of the top surface of the first insulating layer 510 disposed to cover the first electrode 210 and the second electrode 220 may be recessed due to a step of the member disposed therebelow. The light emitting element 300 disposed on the first insulating layer 510 between the first electrode 210 and the second electrode 220 may form an empty space with respect to the recessed top surface of the first insulating layer 510. The light emitting element 300 may be disposed partially spaced apart from the top surface of the first insulating layer 510 with a clearance therebetween, and this clearance may be filled with a material forming the second insulating layer 520 to be described later.

However, the disclosure is not limited thereto. The first insulating layer 510 may be formed to have a flat top surface so that the light emitting element 300 may be disposed thereon. The top surface may extend in a direction toward the first electrode 210 and the second electrode 220, and may be terminated at inclined side surfaces of the first electrode 210 and the second electrode 220. For example, the first insulating layer 510 may be disposed in an area where the electrodes 210 and 220 overlap the inclined side surfaces of the first internal bank 410 and the second internal bank 420, respectively. Contact electrodes 261 and 262 to be described later may be in contact with the exposed areas of the first and second electrodes 210 and 220, and may be smoothly in contact with an end of the light emitting element 300 on the flat top surface of the first insulating layer 510.

The first insulating layer 510 may protect the first electrode 210 and the second electrode 220 while allowing them to be insulated from each other. Further, it may be possible to prevent the light emitting element 300 disposed on the first insulating layer 510 from being damaged by direct contact with other members. However, the shape and structure of the first insulating layer 510 are not limited thereto.

The light emitting element 300 may be disposed on the first insulating layer 510 between the electrodes 210 and 220. For example, at least one light emitting element 300 may be disposed on the first insulating layer 510 disposed between the electrode branches 210B and 220B. However, without being limited thereto, at least some of the light emitting elements 300 disposed in each sub-pixel PXn may be placed in a region other than the region between the electrode branches 210B and 220B. Further, the light emitting element 300 may be disposed such that some areas thereof overlap the electrodes 210 and 220. The light emitting element 300 may be disposed on facing ends of the first electrode branch 210B and the second electrode branch 220B, and may be electrically connected to the electrodes 210 and 220 via the contact electrodes 261 and 262.

As stated above, the light emitting elements 300 that may emit the lights (first, second, third lights) having different wavelengths may be disposed in each of the sub-pixels PXn. Although the drawing only illustrates the first sub-pixel PX1 in which the first light emitting element 301 may be disposed, the above-described structures and features may also be applicable to the second sub-pixel PX2 and the third sub-pixel PX3.

Further, the light emitting element 300 may include multiple layers arranged in a direction horizontal to the via layer 200. The light emitting element 300 of the display device 10 according to an embodiment may include the first semiconductor layer 310, the second semiconductor layer 320, and the active layer 360, and these layers may be arranged in sequence in the direction horizontal to the via layer 200. However, the disclosure is not limited thereto. The order in which the multiple layers of the light emitting element 300 may be arranged may be reverse to the order mentioned above. In some cases, if the light emitting element 300 has a different structure, the multiple layers may be arranged in a direction perpendicular to the via layer 200.

Further, the light emitting element 300 according to an embodiment may further include a first electrode layer 371 and a second electrode layer 372, which may be in contact with the second contact electrode 262 and the first contact electrode 261 to be described later, respectively. The first contact electrode 261 may be in contact with the second electrode layer 372 of the light emitting element 300 as well as the first surface 380S_1 and the third surface 380C2_1 of the insulating film 380 which may be adjacent to the second electrode layer 372. The second contact electrode 262 may be in contact with the first electrode layer 371 as well as the first surface 380C and the second surface 380C1_1 of the insulating film 380 which may be adjacent to the first electrode layer 371. However, the disclosure is not limited thereto, and the display device 10 may include a light emitting element 300 in which the first electrode layer 371 may be in contact with the first contact electrode 261 and the second electrode 372 may be in contact with the second contact electrode 262. The light emitting element 300 according to an embodiment may have a shape extending in a direction, and the length dd1 of the first semiconductor layer 310 may be longer than the length dd2 of the second semiconductor layer 320. The first electrode layer 371 may be disposed farther from the active layer 360 than the second electrode layer 372. As described earlier with reference to FIGS. 15 and 16, the end surface of the insulating film 380 surrounding the first electrode layer 371 positioned farther from the active layer 360 of the light emitting element 300 may have a partially curved shape. As illustrated in the drawings, in the light emitting element 300 disposed on the first insulating layer 510, the insulating film 380 located at an end facing the first electrode 210 may be formed to have a flat end surface, whereas the insulating film 380 located at the other end facing the second electrode 220 may be formed to have a curved end surface. However, the disclosure is not limited thereto, and the light emitting element 300 may be disposed such that the curved portion of the insulating film 380 faces the first electrode 210. For example, the display device 10 may further include the light emitting element 300 disposed such that the first electrode layer 371 faces the first electrode 210.

The second insulating layer 520 may be partially disposed on the light emitting element 300. The second insulating layer 520 may be disposed to partially surround the outer surface of the light emitting element 300. The second insulating layer 520 may protect the light emitting element 300 while also performing a function to fix the light emitting element 300 in the manufacturing process for the display device 10. Further, in an embodiment, some of the material of the second insulating layer 520 may be disposed between a bottom surface of the light emitting element 300 and the first insulating layer 510. As described above, the second insulating layer 520 may be formed to fill the clearance between the light emitting element 300 and the first insulating film 510 formed in the manufacturing process of the display device 10. Accordingly, the second insulating film 520 may be formed to surround the outer surface of the light emitting element 300. However, the disclosure is not limited thereto.

The second insulating layer 520 may extend in the second direction DR2 between the first electrode branch 210B and the second electrode branch 220B in plan view. As an example, the second insulating layer 520 may have an island or linear shape on the via layer 200 in plan view.

The contact electrodes 261 and 262 may be disposed on the electrodes 210 and 220 and the second insulating layer 520. The first contact electrode 261 and the second contact electrode 262 may be disposed spaced apart from each other on the second insulating layer 520. The second insulating layer 520 may insulate the first contact electrode 261 and the second contact electrode 262 from each other lest they should be in direct contact with each other.

Although not illustrated in the drawing, the multiple contact electrodes 261 and 262 may extend in the second direction DR2 in plan view, and spaced apart from each other in the first direction DR1. The contact electrodes 261 and 262 may come into contact with at least one end of the light emitting element 300, and the contact electrodes 261 and 262 may be electrically connected with the first electrode 210 or the second electrode 220 to receive electrical signals. The contact electrodes 261 and 262 may include the first contact electrode 261 and the second contact electrode 262. The first contact electrode 261 may be disposed on the first electrode branch 210B to be in contact with an end of the light emitting element 300, and the second contact electrode 262 may be disposed on the second electrode branch 220B to be in contact with the other end of the light emitting element 300.

The first contact electrode 261 may be in contact with the exposed area of the first electrode 210 on the first internal bank 410, and the second contact electrode 262 may be in contact with the exposed area of the second electrode 220 on the second internal bank 420. The contact electrodes 261 and 262 may be capable of transferring the electrical signals transmitted from the electrodes 210 and 220 to the light emitting element 300, respectively.

The contact electrodes 261 and 262 may include a conductive material. For example, they may include ITO, IZO, ITZO, aluminum (Al), or the like, or a combination thereof. However, embodiments are not limited thereto.

The passivation layer 550 may be disposed on the first contact electrode 261, the second contact electrode 262, and the second insulating layer 520. The passivation layer 550 may function to protect the members disposed on the via layer 200 from the external environment.

Each of the first insulating layer 510, the second insulating layer 520 and the passivation layer 550 described above may include an inorganic insulating material or an organic insulating material. In an embodiment, the first insulating layer 510, the second insulating layer 520 and the passivation layer 550 may include an inorganic insulating material such as silicon oxide (SiOx), silicon nitride (SiNx), silicon oxynitride (SiOxNy), aluminum oxide (Al2O3), aluminum nitride (AlN), and the like, or a combination thereof. The first insulating layer 510, the second insulating layer 520, and the passivation layer 550 may include an organic insulating material such as acrylic resin, epoxy resin, phenolic resin, polyamide resin, polyimide resin, unsaturated polyester resin, polyphenylene resin, polyphenylene-sulfide resin, benzocyclobuten, cardo resin, siloxane resin, silsesquioxane resin, polymethylmetacrylate, polycarbonate, or polycarbonate synthetic resin, or a combination thereof. However, embodiments are not limited thereto.

The display device 10 may further include a larger number of insulating layers. According to an embodiment, the display device 10 may further include a third insulating layer 530 disposed to protect the first contact electrode 261.

Figure 23:
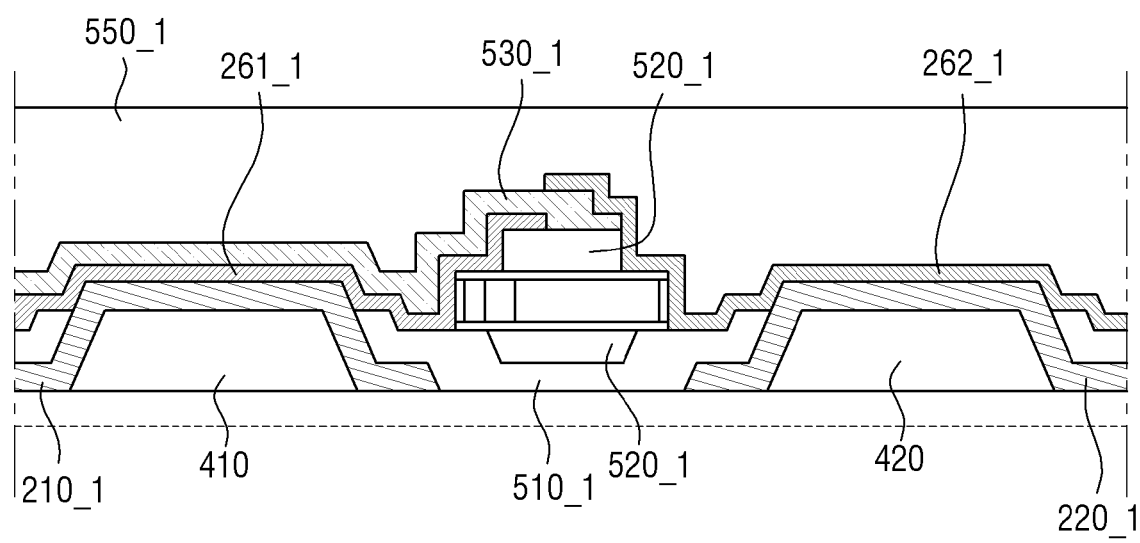
FIG. 23 is a schematic cross-sectional view of a display device according to another embodiment.

FIG. 23 is a schematic cross-sectional view of a display device according to another embodiment.

Referring to FIG. 23, a display device 10_1 according to an embodiment may further include a third insulating layer 530_1 disposed on a first contact electrode 262_1. The display device 10_1 of an embodiment may be different from the display device 10 of FIG. 22 at least in that it may further include the third insulating layer 530_1 and at least a part of a first contact electrode 262_1 may be disposed on the third insulating layer 530_1. In the following description, redundant description will be omitted while focusing on differences.

The display device 10_1 of FIG. 23 may be disposed on the first contact electrode 261_1, and may include the third insulating layer 530_1 serving to insulate the first contact electrode 261_1 and the second contact electrode 262_1 from each other electrically. The third insulating layer 530_1 may be disposed to cover the first contact electrode 261_1, but may be disposed so as not to overlap some areas of the light emitting element 300 so that the light emitting element 300 can be connected to the second contact electrode 262_1. The third insulating layer 530_1 may be partially in contact with the first contact electrode 261_1 and the second insulating layer 520_1 on a top surface of the second insulating layer 520_1. The third insulating layer 530_1 may be disposed to cover an end of the first contact electrode 261_1 on the second insulating layer 520_1. Accordingly, the third insulating layer 530_1 may protect the first contact electrode 261_1 while functioning to insulate the first contact electrode 261_1 from the second contact electrode 262_1.

The lateral surface of the third insulating layer 530_1 on the side where the second contact electrode 262_1 may be located may be aligned with a lateral surface of the second insulating layer 520_1. However, embodiments are not limited thereto. In some embodiments, the third insulating layer 530_1 may include an inorganic insulating material, the same as the first insulating layer 510.

The first contact electrode 261_1 may be disposed between the first electrode 210_1 and the third insulating layer 530_1, and the second contact electrode 262_1 may be disposed on the third insulating layer 530_1. The second contact electrode 262_1 may be partially in contact with the first insulating layer 510_1, the second insulating layer 520_1, the third insulating layer 530_1, the second electrode 220_1, and the light emitting element 300. An end of the second contact electrode 262_1 on the side where the first electrode 210_1 may be located may be disposed on the third insulating layer 530_1.

A passivation layer 550_1 may be disposed on the third insulating layer 530_1 and the second contact electrode 262_1 to protect them. Hereinafter, redundant description will be omitted.

The first electrode 210 and the second electrode 220 of the display device 10 may not necessarily have the shape extending in a direction. The shapes of the first electrode 210 and the second electrode 220 of the display device 10 may not be particularly limited as long as they may be placed apart from each other to provide therebetween the space in which the light emitting elements 300 may be disposed.

Figure 24:
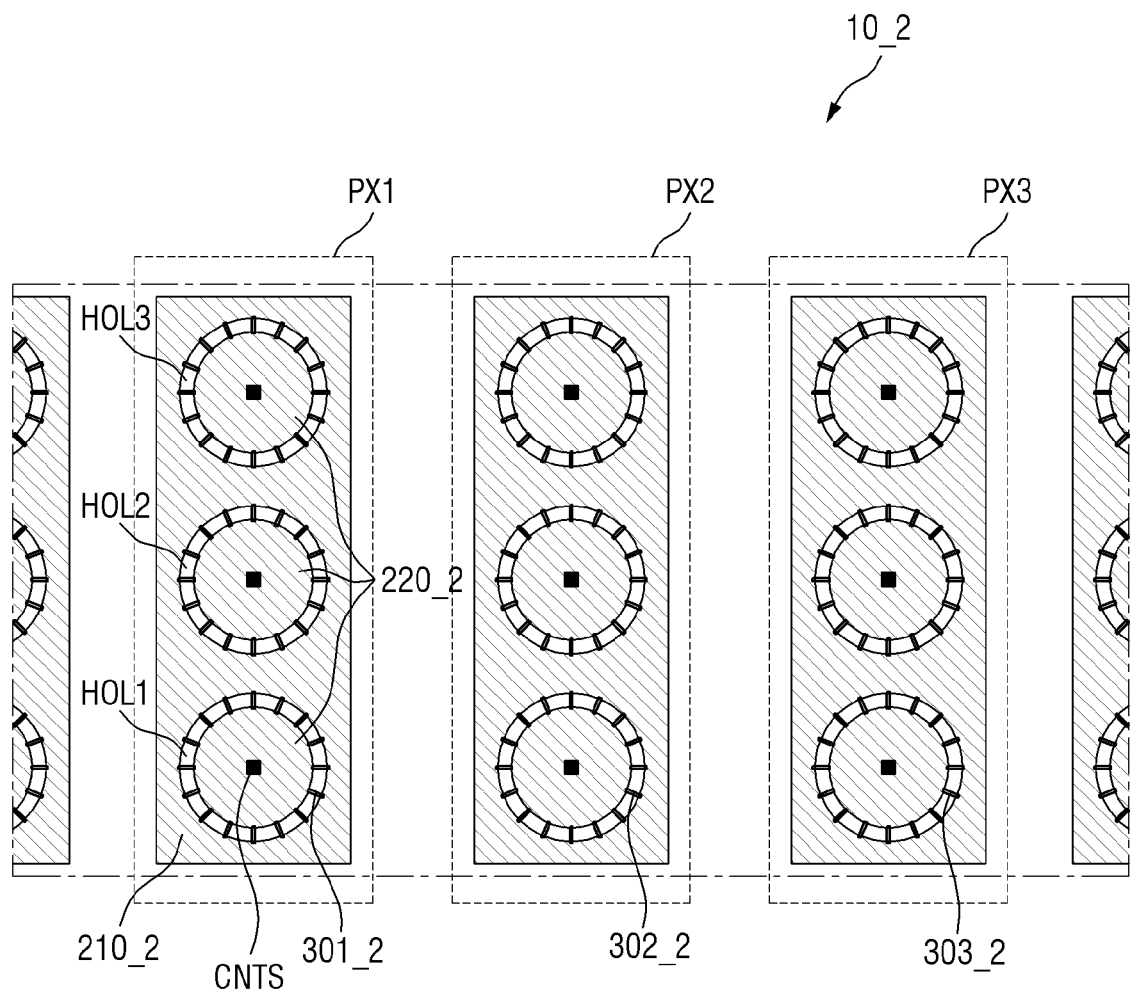
FIG. 24 is a schematic plan view illustrating a pixel of a display device according to still another embodiment.

FIG. 24 is a schematic plan view illustrating a pixel of a display device according to still another embodiment.

Referring to FIG. 24, at least some areas of a first electrode 210_2 and a second electrode 220_2 of a display device 10_2 according to an embodiment may have curvilinear shapes, and the curvilinear area of the first electrode 210_2 may face the curvilinear area of the second electrode 220_2 while being spaced apart from each other. The display device 10_2 according to an embodiment may differ from the display device 10 of FIG. 21 at least in that the shapes of the first and second electrodes 210_2 and 220_2 may be different from those of the display device 10. In the following description, redundant description will be omitted while focusing on differences.

The first electrode 210_2 of the display device 10_2 of FIG. 24 may include multiple holes HOL. For example, as illustrated in the drawing, the first electrode 210_2 may include a first hole HOL1, a second hole HOL2, and a third hole HOL3 arranged in the second direction DR2. However, embodiments are not limited to thereto, and the first electrode 210_2 may include a larger number of holes HOL, a smaller number of holes HOL, or even a single hole HOL. Below, the description will be provided for an example where the first electrode 210_2 includes the first hole HOL1, the second hole HOL2, and the third hole HOL3.

In an embodiment, the first hole HOL1, the second hole HOL2, and the third hole HOL3 may have a circular shape in plan view. Accordingly, the first electrode 210_2 may have curved areas formed by the holes HOL, and face the second electrodes 220_2 in these curved areas. However, this is merely an example, and the disclosure is not limited thereto. The first hole HOL1, the second hole HOL2, and the third hole HOL3 are not particularly limited in shape as long as they can provide spaces for accommodating the second electrodes 220_2 therein. By way of example, the holes may have elliptical shapes, polygonal shapes such as rectangles, or the like, or a combination thereof, in plan view.

The second electrode 220_2 may be plural in number, and the second electrodes 220_2 may be disposed in each sub-pixel PXn. By way of example, in each sub-pixel PXn, three second electrodes 220_2 may be disposed in each sub-pixel PXn to correspond to the first to third holes HOL1, HOL2, and HOL3 of the first electrode 210_2. The second electrodes 220_2 may be respectively disposed within the first to third holes HOL1, HOL2, and HOL3, surrounded by the first electrode 210_2.

In an embodiment, the holes HOL of the first electrode 210_2 may have curved surfaces, and each second electrode 220_2 placed in the corresponding hole HOL of the first electrode 210_2 may also have a curved surface and be disposed to face the first electrode 210_2 with a gap therebetween. As illustrated in FIG. 24, the first electrode 210_2 may include the holes HOL having circular shapes in plan view, and the second electrodes 220_2 may have circular shapes in plan view. The curved surface of the area of the first electrode 210_2 where each hole HOL may be formed may face the curved outer surface of the corresponding one of the second electrodes 220_2 with a gap therebetween. For example, the first electrode 210_2 may be disposed to surround the outer surfaces of the second electrodes 220_2.

As stated above, light emitting elements 300 may be disposed between the first electrode 210_2 and the second electrode 220_2. The display device 10_2 according to an embodiment may include the second electrode 220_2 having the circular shape and the first electrode 210_2 disposed to surround it, and the multiple light emitting elements 300 may be arranged along the outer surface of the second electrode 220_2. As stated above, since the light emitting elements 300 (301_2, 302_2, 303_2) may have the shapes extending in a direction, the light emitting elements 300 arranged along the curved outer surface of the second electrode 220_2 in each sub-pixel PXn may be disposed such that their extension directions may be directed in different directions. Each sub-pixel PXn may have many different light emission directions depending on the directions in which the extension directions of the light emitting elements 300 may be directed. In the display device 10_2 according to an embodiment, by disposing the first and second electrodes 210_2 and 220_2 to have the curvilinear shapes, the light emitting elements 300 disposed between them may be oriented toward different directions, and lateral visibility of the display device 10_2 can be improved.

In concluding the detailed description, those skilled in the art will appreciate that many variations and modifications can be made to the embodiments without substantially departing from the principles of the disclosure. Therefore, the disclosed embodiments are used in a generic and descriptive sense only and not for purposes of limitation.

The invention claimed is:

1. A light emitting element having a shape extending in a direction, comprising:
    a first semiconductor layer and a second semiconductor layer;
    an active layer between the first semiconductor layer and the second semiconductor layer;
    a first electrode layer disposed on a second surface opposite to a first surface of the first semiconductor layer facing the active layer;
    a second electrode layer disposed on a second surface opposite to a first surface of the second semiconductor layer facing the active layer; and
    an insulating film surrounding a side surface of the active layer, at least a part of a side surface of the first electrode layer, and at least a part of a side surface of the second electrode layer,
    wherein a first area of the insulating film adjacent to a side surface of the active layer has a thickness larger than a thickness of a second area of the insulating film adjacent to a side surface of the first electrode layer, and
    wherein a third area of the insulating film adjacent to a side surface of the second electrode layer has a thickness larger than the thickness of the second area of the insulating film adjacent to the side surface of the first electrode layer.

2. The light emitting element of claim 1, wherein the insulating film includes:
    a first surface extending in the direction of the light emitting element;
    a second surface extending between the first surface and a side surface of the first electrode layer; and
    a third surface extending between the first surface and a side surface of the second electrode layer.

3. The light emitting element of claim 2, wherein at least a part of the second surface has a curved shape.

4. The light emitting element of claim 3, wherein
the third surface is formed as a flat surface, and
the third surface and a surface of the second electrode layer are coplanar.

5. The light emitting element of claim 4, wherein a distance between the active layer and the first electrode layer is greater than a distance between the active layer and the second electrode layer.

6. The light emitting element of claim 4, wherein a width of the first surface of the first semiconductor layer is greater than a width of the second surface of the first semiconductor layer.

7. The light emitting element of claim 2, wherein the active layer emits first light having a central wavelength band ranging from about 450 nm to about 495 nm.

8. The light emitting element of claim 2, further comprising:
a third semiconductor layer between the first semiconductor layer and the active layer;
a fourth semiconductor layer between the active layer and the second semiconductor layer; and
a fifth semiconductor layer between the fourth semiconductor layer and the second semiconductor layer.

9. The light emitting element of claim 8, wherein the active layer emits first light having a central wavelength band ranging from about 620 nm to about 750 nm.

\* \* \* \* \*